US011390959B2

United States Patent
Sargent et al.

(10) Patent No.: US 11,390,959 B2
(45) Date of Patent: Jul. 19, 2022

(54) BORON-DOPED COPPER CATALYSTS FOR EFFICIENT CONVERSION OF CO2 TO MULTI-CARBON HYDROCARBONS AND ASSOCIATED METHODS

(71) Applicants: TOTAL SE, Courbevoie (FR); The Governing Council of the University of Toronto, Toronto (CA)

(72) Inventors: Edward Sargent, Toronto (CA); Phil De Luna, Toronto (CA); Fanglin Che, Toronto (CA); Yansong Zhou, Toronto (CA)

(73) Assignees: TOTAL SE, Courbevoie (FR); The Governing Council of the University of Toronto, Toronto (CA)

( * ) Notice: Subject to any disclaimer, the term of this patent is extended or adjusted under 35 U.S.C. 154(b) by 80 days.

(21) Appl. No.: 17/049,740

(22) PCT Filed: Apr. 23, 2019

(86) PCT No.: PCT/EP2019/060329
§ 371 (c)(1),
(2) Date: Oct. 22, 2020

(87) PCT Pub. No.: WO2019/206882
PCT Pub. Date: Oct. 31, 2019

(65) Prior Publication Data
US 2021/0292924 A1      Sep. 23, 2021

Related U.S. Application Data

(60) Provisional application No. 62/661,723, filed on Apr. 24, 2018.

(51) Int. Cl.
| | |
|---|---|
| *C25B 11/091* | (2021.01) |
| *C25B 3/26* | (2021.01) |
| *C30B 29/02* | (2006.01) |
| *C30B 31/04* | (2006.01) |
| *H01M 4/90* | (2006.01) |

(52) U.S. Cl.
CPC .............. *C25B 11/091* (2021.01); *C25B 3/26* (2021.01); *C30B 29/02* (2013.01); *C30B 31/04* (2013.01); *H01M 4/9041* (2013.01); *H01M 4/9091* (2013.01)

(58) Field of Classification Search
None
See application file for complete search history.

(56) References Cited

U.S. PATENT DOCUMENTS 4,959,131 A     9/1990   Cook et al.

FOREIGN PATENT DOCUMENTS

| CN | 1743068 A | * | 3/2006 |
| GB | 1353302 A | | 5/1974 |
| WO | 2014018091 A1 | | 1/2014 |

OTHER PUBLICATIONS

English translation of CN 1743068A (Year: 2006).*

(Continued)

*Primary Examiner* — Wojciech Haske
(74) *Attorney, Agent, or Firm* — Ewing & Jones, PLLC

(57) ABSTRACT

The invention relates to a catalyst system for catalyzing conversion of carbon dioxide into multi-carbon compounds comprising a boron-doped copper catalytic material and associated methods.

14 Claims, 31 Drawing Sheets

(56) References Cited

OTHER PUBLICATIONS

Kendra P. Kuhl et al, "New insights into the electrochemical reduction of carbon dioxide on metallic copper surfaces", Energy & Environmental Science, Cambridge, (2012), vol. 5, No. 5, pp. 7050-7059.

Andrew A. Peterson et al, "How copper catalyzes the electroreduction of carbon dioxide into hydrocarbon fuels", Energy & Environmental Science, Cambridge, (2010), vol. 3, No. 9, pp. 1311-1315.

Quang Thang Trinh et al, "Sub-Surface Boron-Doped Copper for Methane Activation and Coupling: First-Principles Investigation of the Structure, Activity, and Selectivity of the Catalyst", Journal of Physical Chemistry C, (Dec. 20, 2016), vol. 121, No. 2, pp. 1099-1112.

Cao-Thang Dinh, "C02 electroreduction to ethylene via hydroxide-mediated copper catalysis at an abrupt interface", Science, (May 18, 2018), vol. 360, No. 6390, 5 pages.

Che F; Ha S; McEwen J-S, "Elucidating the field influence on the energetics of the methane steam reforming reaction: A density functional theory study", Appl. Catal. B, (2016), vol. 195, pp. 77-89.

Xiao, H. et al., "Cu metal embedded in oxidized matrix catalyst to promote CO2 activation and CO dimerization for electrochemical reduction of CO2", Proc. Natl. Acad. Sci., (2017), vol. 114, pp. 6685-6688.

Xiao H et al., Mechanistic Explanation of the pH Dependence and Onset Potentials for Hydrocarbon Products from Electrochemical Reduction of CO on Cu (111), J. Am. Chem. Soc, (2016), vol. 138, No. 2, pp. 483-486.

Ren, D. et al., "Selective Electrochemical Reduction of Carbon Dioxide to Ethylene and Ethanol on Copper(I) Oxide Catalysts", ACS Catal., (2015), vol. 5, No. 5, pp. 2814-2821.

Mistry, H. et al., "Highly selective plasma-activated copper catalysts for carbon dioxide reduction to ethylene", Nat. Commun., (2016), vol. 7, 9 pages.

Gao D; et al., "Plasma-Activated Copper Nanocube Catalysts for Efficient Carbon Dioxide Electroreduction to Hydrocarbons and Alcohols", ACS Nano, (2017), vol. 11, No. 5, pp. 4825-4831.

Loiudice, A. et al., "Tailoring Copper Nanocrystals towards C2 Products in Electrochemical CO2 Reduction", Angew. Chem. Int. Ed., (2016), vol. 55, No. 19, pp. 5789-5792.

Handoko, A.D. et al., "Mechanistic Insights into the Selective Electroreduction of Carbon Dioxide to Ethylene on Cu2O-Derived Copper Catalysts"; J. Phy. Chem. C, (2016), vol. 120, No. 36, 10 pages.

Murata A; Hori Y, "Product Selectivity Affected by Cationic Species in Electrochemical Reduction of CO2 and CO at a Cu Electrode", B. Chem. Soc. JPN, (1991), vol. 64, No. 1, pp. 123-127.

Sun X; et al., "Design of a Cu(i)/C-doped boron nitride electrocatalyst for efficient conversion of CO2 into acetic acid", Green Chem., (2017), vol. 19, No. 9, pp. 2086-2091.

International Search Report issued in Application No. PCT/EP2019/060329, dated Aug. 2, 2019; 5 pages.

\* cited by examiner

BORON-DOPED COPPER CATALYSTS FOR EFFICIENT CONVERSION OF CO2 TO MULTI-CARBON HYDROCARBONS AND ASSOCIATED METHODS

CROSS-REFERENCE TO RELATED APPLICATIONS

This application claims the benefit of PCT/EP2019/060329 filed Apr. 23, 2019, which claims priority from U.S. 62/661,723 filed Apr. 24, 2018, which are incorporated herein by reference in their entireties for all purposes.

TECHNICAL FIELD

The technical field generally relates to catalytic methods for $CO_2$ reduction, and more particularly to doped electrocatalysts and associated methods for $CO_2$ reduction.

BACKGROUND

The efficient electrochemical conversion of carbon dioxide ($CO_2$) into valuable carbon-based fuels is desirable and technologies that enhances such conversion can, for example, enable the storage of intermittent renewable electricity as well as net reductions of greenhouse gas emissions. Existing catalyst systems for such $CO_2$ reduction processes have a number of drawbacks, including low selectivity for producing certain compounds.

Electrochemical reduction of carbon dioxide ($CO_2RR$) into value-added products has the potential to address the urgent need to store otherwise-intermittent renewable electricity, and to reduce net greenhouse gas emissions. Specifically, the electrosynthesis of $C_2$ hydrocarbons from $CO_2$ on copper (Cu) results in energy-rich precursors for the chemical and materials science sectors. However, in prior reports, widely distributed $C_1$ to $C_3$ species have been generated together with the desired $C_2$ hydrocarbons.

It is important to deepen the understanding of Cu catalyst chemistry in order to be capable of providing next-generation catalyst materials and to produce desired multi-carbon products with much greater selectivity. When such selectivity is achieved, costs related to the product-separation can be reduced or eliminated. There is therefore a need for practical and cost-effective $CO_2RR$ solutions.

Modifying the local electronic structure of copper (Cu) with positive valence sites is a potential route to boost conversion to $C_2$ products. Certain methods used to introduce Cu+ have relied on copper oxide species. However, the resultant $Cu^{\delta+}$ species are prone to being reduced to $Cu^0$ under $CO_2RR$, especially given the high applied reducing potentials needed to electrosynthesize $C_2$ compounds. This has been consistently shown to lead to low activity and thus poor stability.

There is a need for improved techniques and catalyst systems for efficient $CO_2$ reduction and related methods and systems for producing chemical compounds.

SUMMARY

Various techniques are described for facilitating effective electro-catalytic $CO_2$ reduction. For example, a catalyst system for catalyzing conversion of $CO_2$ into multi-carbon compounds can include a boron-doped copper catalytic material. The boron-doped copper material has been found to facilitate various advantages, such as enhanced selectivity for the electro-catalytic production of multi-carbon hydrocarbons from $CO_2$. Catalyst systems can have various features, such as being doped with a non-oxide material (e.g., boron), being manufactured using various techniques, and being implemented in $CO_2$ electro-reduction processes. Various other aspects, features, implementations and embodiments of the technology are described in the appended claims.

According to a first aspect, the invention relates to a catalyst system for catalyzing conversion of $CO_2$ into multi-carbon compounds, the catalyst system being remarkable in that it comprises a boron-doped copper catalytic material.

With preference, one or more of the following embodiments can be used to better define the invention:

The boron-doped copper catalytic material has a porous dendritic morphology.

The boron-doped copper catalytic material has nanostructured features on the scale of 30-40 nm. The wording "nanostructured features" is to be understood as expressing the fact that the as-synthesized boron-doped copper sample is in nano-scale.

The boron-doped copper catalytic material has a particle size ranging from 30 to 40 nm as determined by scanning electron microscopy.

The boron-doped copper catalytic material has a variable boron concentration. The boron concentration is determined by Inductively coupled plasma optical emission spectrometry.

The boron-doped copper catalytic material has a boron concentration that decreases with depth into the material.

The boron-doped copper catalytic material has a boron concentration ranging from 4-7 mol % at the external surface of the catalyst and has a boron concentration below about 4 mol % beyond a depth of about 7 nm from the external surface, the boron concentration is determined by Inductively coupled plasma optical emission spectrometry.

The copper comprises Cu (111).

In a preferred embodiment, the catalyst system according to any one of the previous embodiments further comprises a gas-diffusion layer; and a catalyst layer comprising the boron-doped copper catalytic material applied to the gas-diffusion layer. With preference, the gas-diffusion layer comprises a carbon-based material, and/or is hydrophobic.

According to a second aspect the invention provides a method to produce the boron-doped copper catalytic material for a catalyst system according to the first aspect remarkable in that the copper comprises Cu (111) and the boron-doped copper catalytic material is prepared via incipient wetness impregnation of a single crystal Cu (111) material with a boric acid aqueous solution.

Preferably, one or more of the following features can be used to better define the method of the second aspect:

The impregnation step is followed by a calcination step; with preference, the calcination step is conducted at a temperature ranging from 450° C. to 550° C.

The impregnation step is followed by a calcination step; with preference, the calcination step is conducted with gas selected from hydrogen and/or argon.

The boron-doped copper catalytic material is prepared via combination of $CuCl_2$ and $NaBH_4$ in solution; with preference, the boron-doped copper catalytic material is prepared via injection of a solution of $CuCl_2$ into a solution of $NaBH_4$ causing formation of catalyst precipitates.

The doped metal catalytic material has a boron concentration ranging from 4 to 7 mol % at the external surface of the catalyst and has a boron concentration below about 4 mol % beyond a depth of about 7 nm from the external surface. The boron concentration is determined by Inductively coupled plasma optical emission spectrometry.

According to a third aspect the invention provides a method of manufacturing a boron doped copper catalytic material for a catalyst system according to the first aspect, in order to perform $CO_2$ reduction; the method being remarkable in that it comprises a step of combining $CuCl_2$ with borohydride in solution to form catalyst precipitates in the solution and a step of recovering the catalyst precipitates from the solution; with preference, the borohydride is or comprises sodium borohydride ($NaBH_4$).

Preferably, one or more of the following features can be used to better define the method of the third aspect:
The catalyst precipitates recovered from the solution are subjected to a drying step to form dried catalyst precipitates.
A solution of the $CuCl_2$ and a solution of the $NaBH_4$ are contacted to form the catalyst precipitates.
The concentration of the borohydride in solution is ranging from 3 to 6 M, with preference from 4 to 5 M.
The concentration of the $NaBH_4$ in solution is ranging from 3 to 6 M, with preference from 4 to 5M.
The concentration of the $CuCl_2$ in solution is ranging from 40 to 400 mg/mL, preferably from 80 to 200 mg/mL, more preferably from 100 to 150 mg/mL.
The solutions of $CuCl_2$ and a solution of the borohydride are provided in volume ratios ranging from 10:1 to 1:10, preferably from 5:1 to 1:5, more preferably from 2:1 to 1:2, and even more preferably from 2:1 to 1:1.
The solutions of $CuCl_2$ and a solution of the $NaBH_4$ are provided in volume ratios ranging from 10:1 to 1:10, preferably from 5:1 to 1:5, more preferably from 2:1 to 1:2, and even more preferably from 2:1 to 1:1.
The doped metal catalytic material has a boron concentration ranging from 4 to 7 mol % at the external surface of the catalyst and has a boron concentration below about 4 mol % beyond a depth of about 7 nm from the external surface. The boron concentration is determined by Inductively coupled plasma optical emission spectrometry.
The copper has a (111) surface.
The copper is or comprises Cu (111).

According to a fourth aspect, the invention provides a catalyst system produced by a method according to the second or to the third aspect.

According to a fifth aspect, the invention provides a method for electrochemical production of a multi-carbon hydrocarbon product, comprising:
contacting $CO_2$ gas and an electrolyte with an electrode comprising the catalyst system as defined according to the first aspect or according to the fourth aspect, the catalyst system comprising a catalyst layer comprising the boron-doped copper catalytic material, and an optional a gas-diffusion layer, wherein the gas-diffusion layer, when present, is arranged in such a way that the $CO_2$ gas diffuses through the gas-diffusion layer and contacts the catalyst layer;
applying a voltage to provide a current density to cause the $CO_2$ gas contacting the catalyst layer to be electrochemically converted into the multi-carbon hydrocarbon product; and
recovering the multi-carbon hydrocarbon product.

Preferably, the invention provides a method for electrochemical production of a multi-carbon hydrocarbon product, comprising:
contacting $CO_2$ gas and an electrolyte with an electrode comprising the catalyst system as defined according to the first aspect or according to the fourth aspect, the catalyst system comprising a catalyst layer comprising the boron-doped copper catalytic material and a gas-diffusion layer, wherein the gas-diffusion layer is arranged in such a way that the $CO_2$ gas diffuses through the gas-diffusion layer and contacts the catalyst layer;
applying a voltage to provide a current density to cause the $CO_2$ gas contacting the catalyst layer to be electrochemically converted into the multi-carbon hydrocarbon product; and
recovering the multi-carbon hydrocarbon product.

More preferably, the gas-diffusion layer is hydrophobic.

With preference, one or more of the following features can be used to better define the process according to the fifth aspect:
The current density provided in the current collection structure is predetermined for selective electrochemical conversion of the $CO_2$ into a target hydrocarbon product, with preference the target hydrocarbon product is ethylene.
The electrolyte comprises an alkaline potassium compound.

According to a sixth aspect, the invention contemplates the use, in a fuel cell, of the catalyst system as defined in the first aspect, or according to the fourth aspect.

According to a seventh aspect, the invention contemplates the use, for production of a hydrocarbon product, of the catalyst system as defined in the first aspect, or according to the fourth aspect.

According to an eighth aspect, the invention contemplates the use, for production of a $C_2$ hydrocarbon product, of the catalyst system as defined in the first aspect, or according to the fourth aspect; with preference the $C_2$ hydrocarbon product is selected from ethylene and/or ethanol.

According to a ninth aspect, the invention contemplates the use of the catalyst system as defined in the first aspect, or according to the fourth aspect, for changing selectivity of multicarbon-hydrocarbon products during $CO_2$ electro-reduction.

According to an eleventh aspect, the invention contemplates the use of the catalyst system as defined in the first aspect, or according to the fourth aspect, for enhancing selectivity towards production of multicarbon-hydrocarbon products during $CO_2$ electro-reduction compared to a corresponding catalyst doped with an oxide dopant.

According to a twelfth aspect, the invention contemplates the use of the catalyst system as defined in the first aspect, or according to the fourth aspect, for providing a selectivity ratio of $C_2:C_1$ hydrocarbon products during $CO_2$ electro-reduction of at least 30, at least 50, at least 100, at least 150, at least 200, at least 300, at least 500, at least 700, at least 900, or at least 930, or between two of the aforementioned values.

DETAILED DESCRIPTION

Figure 1:
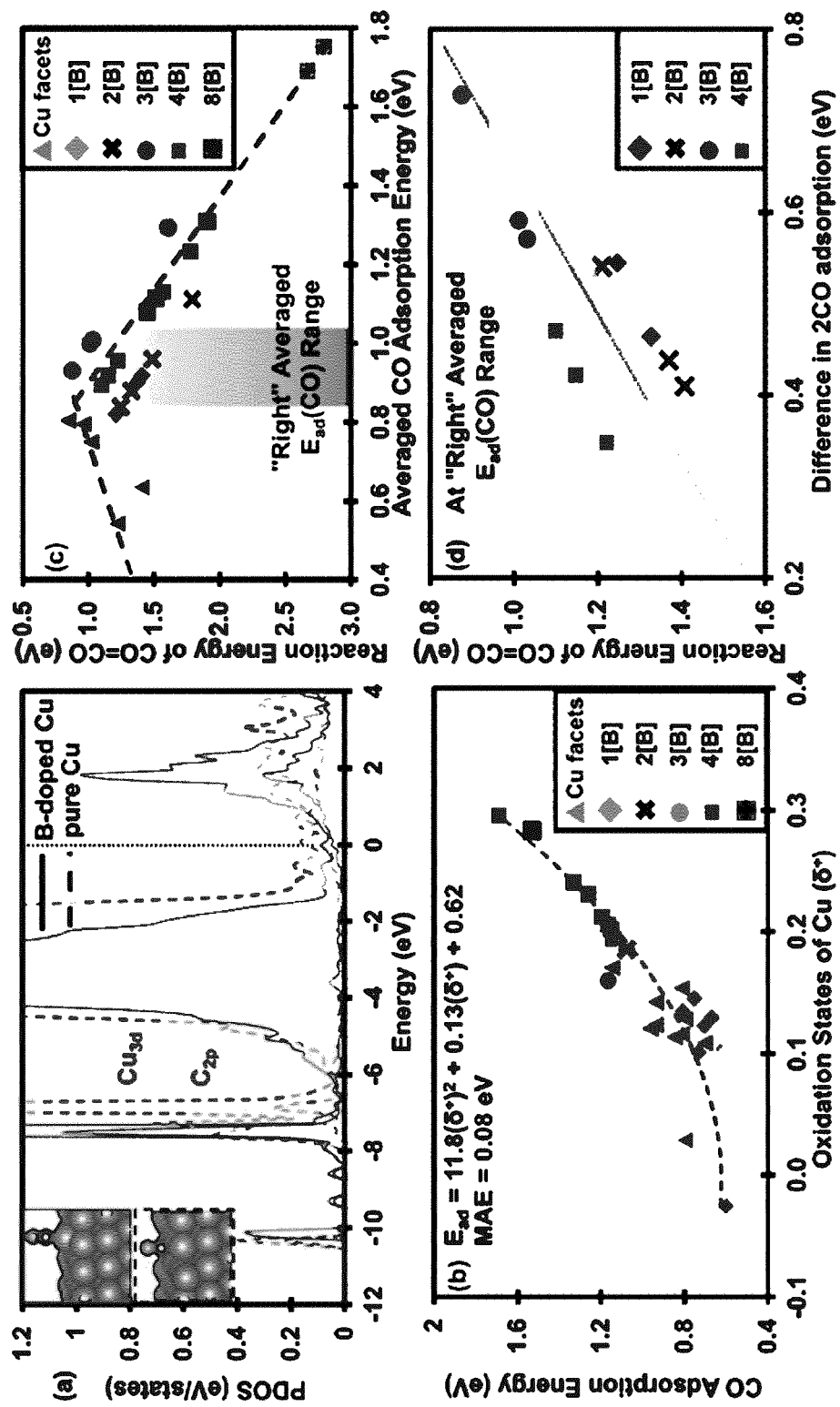
FIG. 1 DFT calculations on enhancing $C_2$ electroproduction. (a) Partial density of states (PDOS) plot of Cu3d and C2p orbitals in Cu and B-doped Cu catalysts; (b) The CO adsorption energy as a function of the oxidation state of Cu; (c) The CO═CO dimerization energy as a function of the averaged adsorption energy of two adsorbed CO molecules; (d) Plot of CO═CO dimerization energy versus the difference in two adsorbed CO molecules.

Techniques described herein relate to enhanced catalyst systems that can be used for $CO_2$ reduction and the production of multi-carbon compounds. The hydrocarbon molecules may be abbreviated C1, C2, C3 . . . Cn where "n" represents the number of carbon atoms in the one or more hydrocarbon molecules.

The Catalyst System

The invention provides a catalyst system that includes a doped metal catalytic material comprising a metal and a non-oxide dopant. The metal is preferably copper, and the dopant is preferably boron. Thus, in accordance to the invention, the catalyst system for catalyzing conversion of $CO_2$ into multi-carbon compounds, comprises a boron-doped copper catalytic material.

The catalyst system can be used for $CO_2$ reduction and production of multi-carbon compounds. With preference, the $C_2$ hydrocarbon product is selected from ethylene and/or ethanol.

The boron dopant can facilitate modifying an oxidation state of the metal and provides maintenance of the oxidation state during catalysis. The invention is remarkable in that it describes the first tunable and stable Cu+ based catalyst. When boron was introduced as a dopant into Cu, the Cu atoms transfer electrons to the B atoms, resulting in a positively charged Cu oxidation state. The present invention proves using synchrotron spectroscopies that the Cu oxidation state is finely controlled through the use of this new strategy. This directly translates into improved stability under $CO_2RR$.

With preference, the boron-doped copper catalytic material has a porous dendritic morphology. In a preferred embodiment the copper is or comprises Cu (111). As known to the person skilled in the art, the Cu (111) is a Cu single crystal with (111) facet exposed.

Preferably, the boron-doped copper catalytic material has nanostructured features on the scale of 30-40 nm. Preferably, the boron-doped copper catalytic material has a particle size ranging from 30 to 40 nm as determined by scanning electron microscopy.

In a preferred embodiment, the boron-doped copper catalytic material has a variable boron concentration, that decreases with depth into the material. With preference, the boron-doped copper catalytic material has a boron concentration ranging from 4 to 7 mol % proximate to an external surface of the catalyst and has a boron concentration below about 4 mol % beyond a depth of about 7 nm. The boron concentration is determined by Inductively coupled plasma optical emission spectrometry.

The doped metal catalytic material can be substantially Cu doped exclusively with B, Cu doped with B and another dopant, or composed of various other combinations of compounds. The doped metal catalytic material can also be produced by various methods and sub-steps which can be combined together in various ways, some of which are described herein. The doped metal catalytic material can also be used as a catalyst layer that is part of an overall electrode system, which can have various features and constructions, some of which are described herein.

In addition, examples of the doped catalyst system described herein can be used as a catalyst layer in a composite multilayered electrocatalyst (CME) that includes a polymer-based gas-diffusion layer, a current collection structure, and the catalyst layer, sandwiched in between. The current collection structure can include a carbon nanoparticle layer applied against the catalyst layer, and a graphite layer applied against the nanoparticle layer. In one possible implementation of the CME, it includes a hydrophobic polymer-based support such as polytetrafluoroethylene (PTFE); a B-doped Cu catalyst material deposited on top; a layer of carbon-based nanoparticles (NPs) atop the catalyst; and an ensuing layer of graphite as the electron conductive layer. In this configuration, the PTFE layer, which can substantially be pure PTFE or similar polymer, acts as a more stable hydrophobic gas-diffusion layer that prevents flooding from the catholyte; carbon NPs and graphite stabilize the metal catalyst surface; the graphite layer serves both as an overall support and current collector. In an alternative implementation, the CME includes a hydrophobic polymer-based layer; the B-doped Cu catalyst deposited on top; and then a layer of conductive material such as graphite deposited on top of the catalyst layer. In this configuration, the stabilization material (e.g., carbon nanoparticles) is not present as a distinct layer in between the graphite and the catalyst layers. Other features of the CME and related $CO_2RR$ methods as described in Cao-Thang Dinh & al. "CO2 electroreduction to ethylene via hydroxide-mediated copper catalysis at an abrupt interface" *Science* 18 May 2018 Vol. 360, Issue 6390, pp. 783-787 (DOI: 10.1126/science.aas 9100) can be used in combination with the catalyst system and methods described herein.

Therefore, in a preferred embodiment, the catalyst system further comprises a gas-diffusion layer; and a catalyst layer comprising the boron-doped copper catalytic material. With preference, the gas-diffusion layer comprises a carbon-based material. In an embodiment, the gas diffusion membrane includes a hydrophobic polymer-based support such as polytetrafluoroethylene or similar polymers.

Therefore, the invention encompasses a system for $CO_2$ electroreduction to produce multi-carbon hydrocarbons, comprising:
  an electrolytic cell configured to receive a liquid electrolyte and $CO_2$ gas;
  an anode; and
  a cathode comprising a catalyst system as defined above.

The invention also relates to the use of the catalyst system according to the invention in a fuel cell.

Preparation of the Catalyst System

In terms of production, the doped Cu catalysts can be synthesized through incipient wetness impregnation of a single crystal Cu (111) material.

Therefore, the invention provides a method to produce the boron-doped copper catalytic material for a catalyst system according to the first aspect remarkable in that the copper comprises Cu (111) and the boron-doped copper catalytic material is prepared via incipient wetness impregnation of a single crystal Cu (111) material with a boric acid aqueous solution.

In a preferred embodiment, the impregnation step is followed by a calcination step; with preference, the calcination step is conducted at a temperature ranging from 450° C. to 550° C., and/or with gas selected from hydrogen and/or argon.

The boron-doped copper catalytic material is prepared via combination of $CuCl_2$ and $NaBH_4$ in solution; with preference, the boron-doped copper catalytic material is prepared via injection of a solution of $CuCl_2$ into a solution of $NaBH_4$ causing formation of catalyst precipitates.

The doped metal catalytic material has a boron concentration ranging from 4 to 7 mol % at the external surface of the catalyst and has a boron concentration below about 4 mol % beyond a depth of about 7 nm from the surface.

In terms of production, the doped Cu catalysts can also be synthesized through injection of $CuCl_2$ into highly concentrated $NaBH_4$.

Therefore, the invention provides a method of manufacturing a boron doped copper catalytic material for a catalyst system as described above in order to perform $CO_2$ reduction; the method being remarkable in that it comprises a step of combining $CuCl_2$ with borohydride in solution to form catalyst precipitates in the solution and recovering the catalyst precipitates from the solution. With preference, the catalyst precipitates recovered from the solution are subjected to a drying step to form dried catalyst precipitates.

Borohydride is or comprises sodium borohydride ($NaBH_4$). Thus, a solution of the $CuCl_2$ and a solution of the $NaBH_4$ are contacted to form the catalyst precipitates.

In an embodiment, the borohydride is selected from sodium borohydride (NaBH$_4$), potassium borohydride (KBH$_4$), and any mixture thereof.

In an embodiment, the concentration of the borohydride in solution, preferably the NaBH$_4$ in solution, is ranging from 3 to 6 M, with preference from 4 to 5M.

In an embodiment, the concentration of the CuCl$_2$ in solution is ranging from 40 to 400 mg/mL, preferably from 80 to 200 mg/mL, more preferably from 100 to 150 mg/mL.

Preferably, the solutions of CuCl$_2$ and a solution of the borohydride, preferably the NaBH$_4$, are provided in volume ratios ranging from 10:1 to 1:10, preferably from 5:1 to 1:5, more preferably from 2:1 to 1:2, and even more preferably from 2:1 to 1:1.

In a preferred embodiment, the copper has a (111) surface, i.e. the copper is or comprises Cu(111).

Method for Electrochemical Production of Multi-Carbon Hydrocarbons and/or Alcohols Embodiments of the new catalyst material enable sustained high C$_2$ Faradaic efficiencies for one time-operation. The present invention demonstrates 80% Faradaic efficiency of C$_2$ without C$_1$ and C$_3$ species for Cu-based catalyst. The present invention further shows that B doping leads to stable catalysts that provide CO$_2$RR to multi-carbon hydrocarbons with stability that exceeds about 40 hours operating time, an order-of-magnitude improvement over the stability of the highest-performing previous CO$_2$RR-to-C$_2$ reports.

The present invention describes that electron localization drives CO$_2$ reduction to multi-carbon hydrocarbons in the context of the catalyst systems described herein. The catalyst electrode includes a metal and a dopant. The dopant modifies the oxidation state of the metal and maintains the oxidation state during operation. In one example of the catalyst material, the metal is Cu and the dopant is B. B-doping improves the stability of Cu$^{\delta+}$ species in the Cu catalyst.

Therefore, the invention contemplates a method for electrochemical production of a multi-carbon hydrocarbon product, comprising:
  contacting CO$_2$ gas and an electrolyte with an electrode comprising the catalyst system as defined above or produced according to the above described method, the catalyst system comprising a gas-diffusion layer and a catalyst layer comprising the boron-doped copper catalytic material, in such a way that the CO$_2$ gas diffuses through the hydrophobic gas-diffusion layer and contacts the catalyst layer;
  applying a voltage to provide a current density to cause the CO$_2$ gas contacting the catalyst layer to be electrochemically converted into the multi-carbon hydrocarbon product; and
  recovering the multi-carbon hydrocarbon product.

In accordance with the invention, the current density provided in the current collection structure is predetermined for selective electrochemical conversion of the CO$_2$ into a target hydrocarbon product, with preference the target hydrocarbon product is ethylene.

In an embodiment, the electrolyte comprises an alkaline potassium compound; with preference, the electrolyte is or comprises KOH.

Preferably the voltage applied is ranging from 300 to 700 mV, more preferably from 400 to 600 mV, and even more preferably from 450 to 550 mV, at potentials of −0.95 V vs RHE.

It will be appreciated from the overall description and the experimentation section in particular that the catalyst systems and materials as well as the associated methods described herein can have a number of optional features, variations, and applications.

Methods

Particle size of the boron-doped copper catalytic material: A scanning electron microscope (Hitachi SU8230) and electron tomography in a transition electron microscope (TEM) (FEI Tecnai G2) were employed to observe the morphology of the samples.

Boron concentration Inductively coupled plasma optical emission spectrometry (ICP-OES, Optima 7300 DV) was carried out to determine the boron contents doped into copper. In total, 1 mg of the samples was completely dissolved into 50 ml trace metal HNO3 (5 mM) using a sonication bath for 30 min for the ICP-OES test. Dissolving-time-dependent ICP-OES experiments were carried out by withdrawing 10 ml of the solution at time 0 (~10 s), 2 min, 5 min, 10 min and 30 min.

DFT calculations. Density functional theory calculations were performed using the Vienna Ab Initio Simulation Package (VASP) code. Full computational simulation details are provided below.

Computational Method

Density functional theory calculations were carried out with the Vienna Ab Initio Simulation Package (VASP) code. Perdew-Burke-Ernzerhof (PBE) functionals were used to treat the exchange-correlation interactions and the projector-augmented wave (PAVV) method was used to solve the ion-electron interactions in the periodic system.

Characterization: The crystal structures of the samples were characterized with a powder X-ray diffractometer (XRD, MiniFlex600) using Cu-K$\alpha$ radiation ($\lambda$=0.15406 nm). Scanning electron microscope (SEM, Hitachi SU-8230) and electron tomography in a transition electron microscope (TEM, FEI Tecnai G$^2$) were employed to observe the morphology of the samples. A tilt series of 2D TEM images for electron tomography was acquired from −75 to +75 degrees with a tilt increment of 3 degrees at 200 kV. The series was used as an input for 3D reconstruction using the SIRT algorithm implemented in the ASTRA toolbox. X-ray photoelectron spectroscopy (XPS) measurements were carried out on a K-Alpha XPS spectrometer (PHI 5700 ESCA System), using Al K$\alpha$ X-ray radiation (1486.6 eV) for excitation. Ultraviolet photoelectron spectroscopy (UPS) spectra were measured using He I excitation (21.2 eV) with SPECS PHPIBOS 150 hemispherical energy analyzer in the ultrahigh vacuum (UHV) chamber of the XPS instrument. Carbon C1s line with the position at 284.6 eV was used as a reference to correct the charging effect. Inductively coupled plasma optical emission spectrometer (ICP-OES, Optima 7300 DV) was carried out to determine the B contents doped into Cu. 1 mg of the samples which were completely dissolved into 50 mL trace metal HNO$_3$ (5 mM) using sonication bath for 30 min for the ICP-OES test. Dissolving time-dependent ICP-OES experiments were carried out by withdrawing 10 mL of the solution at 0 (~10s), 2 min, 5 min, 10 min and 30 min. Ex-situ X-ray absorption measurements at the Cu K-edges were performed at the 20-BM-B beamline at the Advanced Photon Source Advanced Photon Source (APS) at Argonne National Laboratory. In-situ XAS measurements at the Cu K-edges were performed at the Soft X-ray Microcharacterization Beamline (SXRMB) 06B1-1 beamline at Canadian Light Source (CLS).

Electrochemical active surface area (ECSA) measurement. Two methods were used to estimate the ECSA of B-doped Cu and control samples. All electrodes were electrochemically reduced using cyclic voltammetry (CV) method (−0.5 V to −2 versus RHE, 0.1 V/s, 5 cycles) before ECSA measurements. Lead (Pb) under-potential deposition (UPD) method was firstly used to estimate the ECSA of B-doped Cu and control samples. Briefly, a freshly prepared 50 mL solution containing 100 mM of $HClO_4$ with 0.5 mM of $PbCl_2$ and 50 mM KCl was used. Subsequently, the electrode was held at −0.375 V for 10 min prior to the stripping of Pb by sweeping the potential from −0.5 to −0.1 V (vs Ag/AgCl) at 10 mV/s. The Cu ECSA calculations assume a monolayer of Pb adatoms coverage over Cu and $2e^-$ Pb oxidation with a conversion factor of 310 μC/cm$^2$.

The ECSA values of as-made electrodes were also evaluated by cyclic voltammetry (CV) using the ferri-/ferrocyanide redox couple ($[Fe(CN)_6]^{3-/4-}$) as a probe. Cyclic voltammetry was carried out in a nitrogen-purged 5 mM $K_3Fe(CN)_6$/0.1 M KCl solution with platinum gauze as the counter electrode. ECSA values were calculated using the Randles-Sevcik equation:

$$Ip = (2.36 \times 10^5) n^{3/2} A D^{1/2} C v^{1/2}$$

$I_p$ is the peak current (A), n=1, D is the diffusion coefficient $D=4.34 \times 10^{-6}$ cm$^2$ s$^{-1}$, A is the electrochemical active surface area (cm$^2$), C is the concentration of potassium ferricyanide ($5 \times 10^{-6}$ mol cm$^{-3}$), v is the scan rate (5 mV s$^{-1}$).

Gibbs Free Energy Calculations

Since the process of the $CO_2$ reduction over a Cu catalyst to various products involves both phase changed reactions (i.e., CO adsorption/desorption, $CO_2$ adsorption, $CH_4$, $C_2H_4$ and $C_2H_5OH$ desorption) and surface reactions. Two separate sections below are provided to explain how the change in Gibbs free energy is calculated with pure DFT calculations.

For the phase changed Gibbs free energy, such as a gas phase species A desorption from the Cu surface at a given temperature and 1 atm, it is given by Equation (S8).

$$\Delta G_A(T, P^0) = E_{ad} + \Delta H^0(T) - T\Delta S^0(T, P^0) \quad (S8)$$

where $E_{ad}$ is the calculated adsorption energy of the gas phase species A (given in Eq. (S1)). In addition, $\Delta H^0(T)$ gives the temperature dependence of the enthalpy change at standard pressure for the adsorption of molecule A (room temperature 298 K in particular), which is given by:

$$\Delta H^0(T) = H_{trans}^A + H_{rot}^A + H_{vib}^A - H_{vib}^{A^*} \quad (S9)$$

$$\Delta S^0(T) = S_{trans}^A + S_{rot}^A + S_{vib}^A - S_{vib}^{A^*} \quad (S10)$$

where $H_{trans}^A$, $H_{rot}^A$, $H_{vib}^A$ and $H_{vib}^{A^*}$ is the enthalpy at temperature T and standard pressure for the translational, rotational, vibrational modes of the A molecule in the gas phase, and the thermal enthalpy energy corrections at temperature T for the adsorbed A species, respectively. $S_{trans}^A$, $S_{rot}^A$, $S_{vib}^A$ and $S_{vib}^{A^*}$ are entropy contributions from the 3-D translational, 2-D rotational, vibrational modes for the gas phase molecule A, and the entropy contributions of the adsorbed A species. More details regarding how each term was calculated were provided in Che F, Ha S, McEwen J-S. Elucidating the field influence on the energetics of the methane steam reforming reaction: A density functional theory study. *Appl. Catal. B* 2016, 195: 77-89.

It is also noteworthy that the has demonstrated that the Cu surface atoms not directly interact with intermediates when the vibrational frequencies were calculated. Thus, the invention only includes the vibrational frequencies of the adsorbates and the Cu surface atoms directly interacting with adsorbates.

For the surface reaction (i.e., A*→B*), the change in the Gibbs free energy at temperature T and 1 atm is given by:

$$\Delta G_{A^* \to B^*}(T, P^0) = \Delta H_{rxn} + \Delta H^0(T) - T\Delta S^0(T, P^0) \quad (S11)$$

where $\Delta H_{rxn}$ is the calculated reaction energy of the A*→B* reaction (calculated by Eq. (S2)). $\Delta H^0(T)$ and $\Delta S^0(T, P^0)$ are the enthalpy energy differences and entropy differences between the initial and final states. More details regarding of how each of term in Equation (S11) are also explained in Che F, Ha S, McEwen J-S. Elucidating the field influence on the energetics of the methane steam reforming reaction: A density functional theory study. *Appl. Catal. B* 2016, 195: 77-89.

EXAMPLES

The advantages of the present invention are illustrated by the following examples. However, it is understood that the invention is not limited to these specific examples.

The electrochemical reduction of carbon dioxide ($CO_2RR$) to multi-carbon products has attracted intense research attention since it provides an avenue to the renewable-electricity-powered synthesis of value-added carbon-based fuels and feedstocks. Unfortunately, the efficiency of $C_2$ product conversion remains below that relevant to implementation at scale. Modifying the local electronic structure of copper (Cu) with positive valence sites has been a potential route to boosting conversion to $C_2$ products. The present invention describes the use of boron (B) to tune the ratio of $Cu^{\delta+}$ to $Cu^0$ active sites. Simulations show that the ability to tune the average oxidation state of Cu enables thereby control over CO adsorption and dimerization; and that engineering this ratio allows implementing a preference for the electrosynthesis of $C_2$ products. The present invention reports experimentally a $C_2$ Faradaic efficiency of 79±2% on B-doped Cu catalysts. The present invention further shows that B doping leads to stable catalysts that provide $CO_2RR$ to multi-carbon hydrocarbons with stability that exceeds about 40 hours operating time, an order-of-magnitude improvement over the stability of the highest-performing previous $CO_2RR$-to-$C_2$ reports.

Among $CO_2$ reduction products, $C_2$ hydrocarbons including ethylene ($C_2H_4$) and ethanol ($C_2H_5OH$) benefit from impressive energy densities and thus higher economic value per unit mass compared to $C_1$ counterparts. To date, Cu is one of the most promising candidates for electroreducing $CO_2$ to multi-carbon hydrocarbons. Previous research has shown that judiciously-modified Cu is especially selective for electrochemically produced $C_2$; however, $C_1$ and $C_3$ species are generated simultaneously. It is of interest to modify Cu to ultimately narrow the distribution of $CO_2RR$ products towards a single class of target hydrocarbons; and achieving such high selectivity combined with high activity is an important frontier for the field.

Surface $Cu^{\delta+}$ sites in Cu catalysts have been suggested to be active sites for $CO_2RR$: indeed, high Faradaic efficiencies for $C_2$ products have been achieved by introducing $Cu^{\delta+}$ into Cu catalysts. $Cu^{\delta+}$ has previously been introduced using oxygen-contained species, such as by deriving Cu catalysts from oxidized Cu. However, the resultant $Cu^{\delta+}$ species are prone to being reduced to $Cu^0$ under $CO_2RR$, especially given the high applied reducing potentials needed to electrosynthesize $C_2$ compounds. This has made the study of the role of $Cu^{\delta+}$ challenging; and, at an applied level, it likely contributes to the loss in $CO_2RR$ to multi-carbon performance over the first few hours of reaction.

Studies described herein assessed introducing modifier elements—atoms that could tune and increase the stability of $Cu^{\delta+}$ in a lasting manner, even following protracted $CO_2RR$—would contribute to the understanding of $CO_2$ to $C_2$ synthesis, and to its practical implementation.

Example 1: DFT Study on the Effect of the Oxidation State of Cu Atoms

Figure 5:
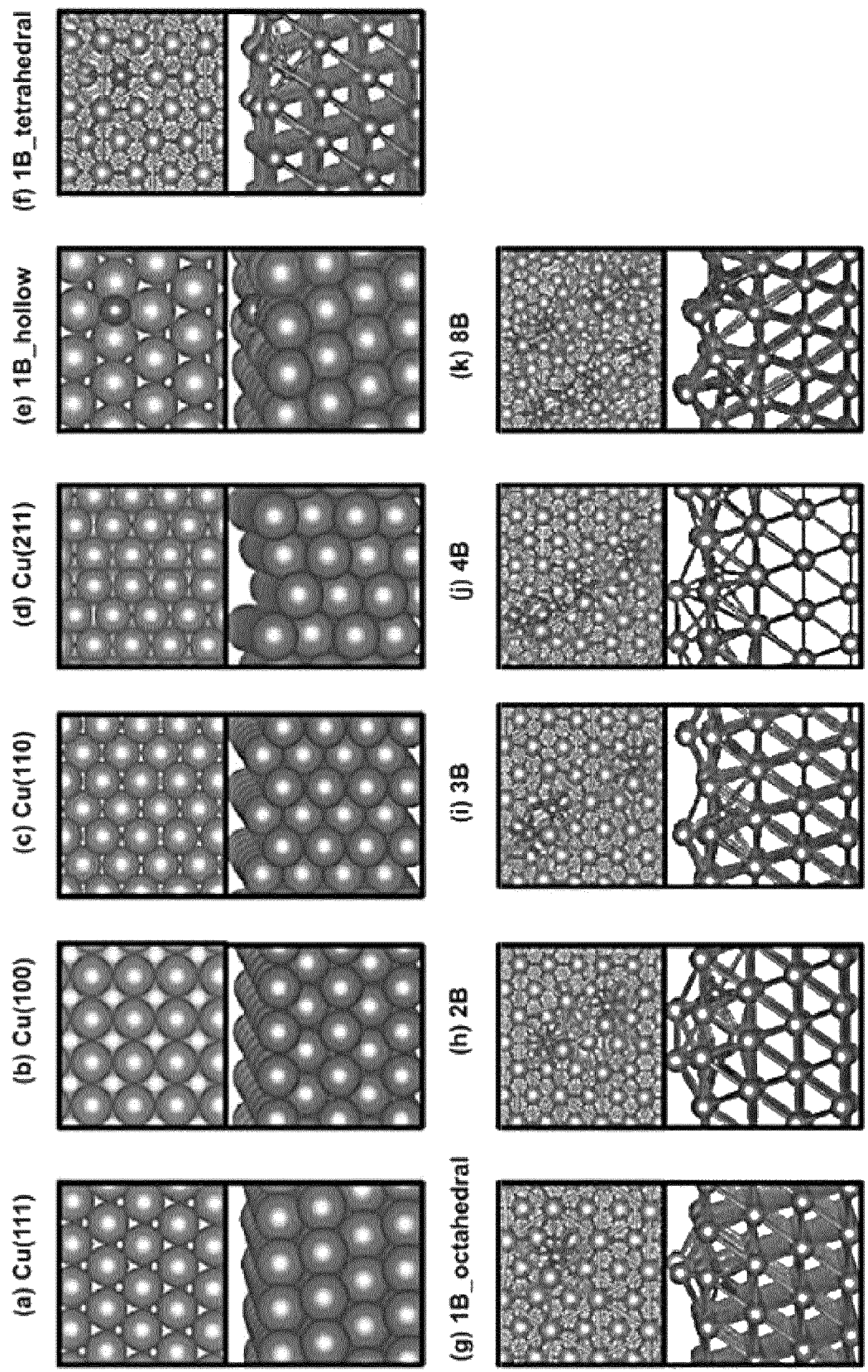
FIG. 5 The DFT models of different Cu facets and a Cu(111) surface with various concentrations of boron.

As shown in FIG. 5, the study chose Cu(111), Cu(100), Cu(110), and Cu(211) to validate that the CO═CO dimerization is closely related the oxidation state of Cu atoms. For the p(4×4) Cu(111) and Cu(100) supercell, a Monkhorst-Pack mesh with a grid of (3×3×1) kpoints and a plane wave expansion of up to 400 eV. In addition, for the p(3×3) Cu(110) and p(2×4) Cu(211) facets, a Monkhorst-Pack mesh with a grid of (4×4×1) kpoints and a plane wave expansion of up to 400 eV. All of the examined surfaces have an approximate 15 Å vacuum layer separation between each periodic unit cell.

Example 2: Study on the Effect of the Boron Concentration

The study examined the various concentrations of boron in the Cu(111) slab, as given in FIG. 5. When the boron concentration is only 1/16 monolayer (ML), different adsorption sites for the boron species were tested. It is reminded here, that ML is the coverage unit, which means the ratio of atoms on the adsorption to the base atoms. The DFT calculations showed that the configuration when boron sits at the subsurface octahedral sites is the most favorable one. Thus, for various boron concentration configurations, the study simulated the B-doped Cu systems with boron staying at the subsurface octahedral sites. It is also worth mentioning the nomenclature of the B-doped Cu(111) system in FIG. 5(d)-(f): when the systems are labeled as 1 [B], 2[B], 3[B], 4[B], 8[B], they stand for the B-doped Cu system with subsurface B concentrations of 1/16 monolayer (ML), 2/16 ML, 3/16 ML, 4/16 ML, 8/16 ML, respectively. FIG. 5 shows DFT models of different Cu facets and a Cu(111) surface with various concentrations of boron.

Figure 6:
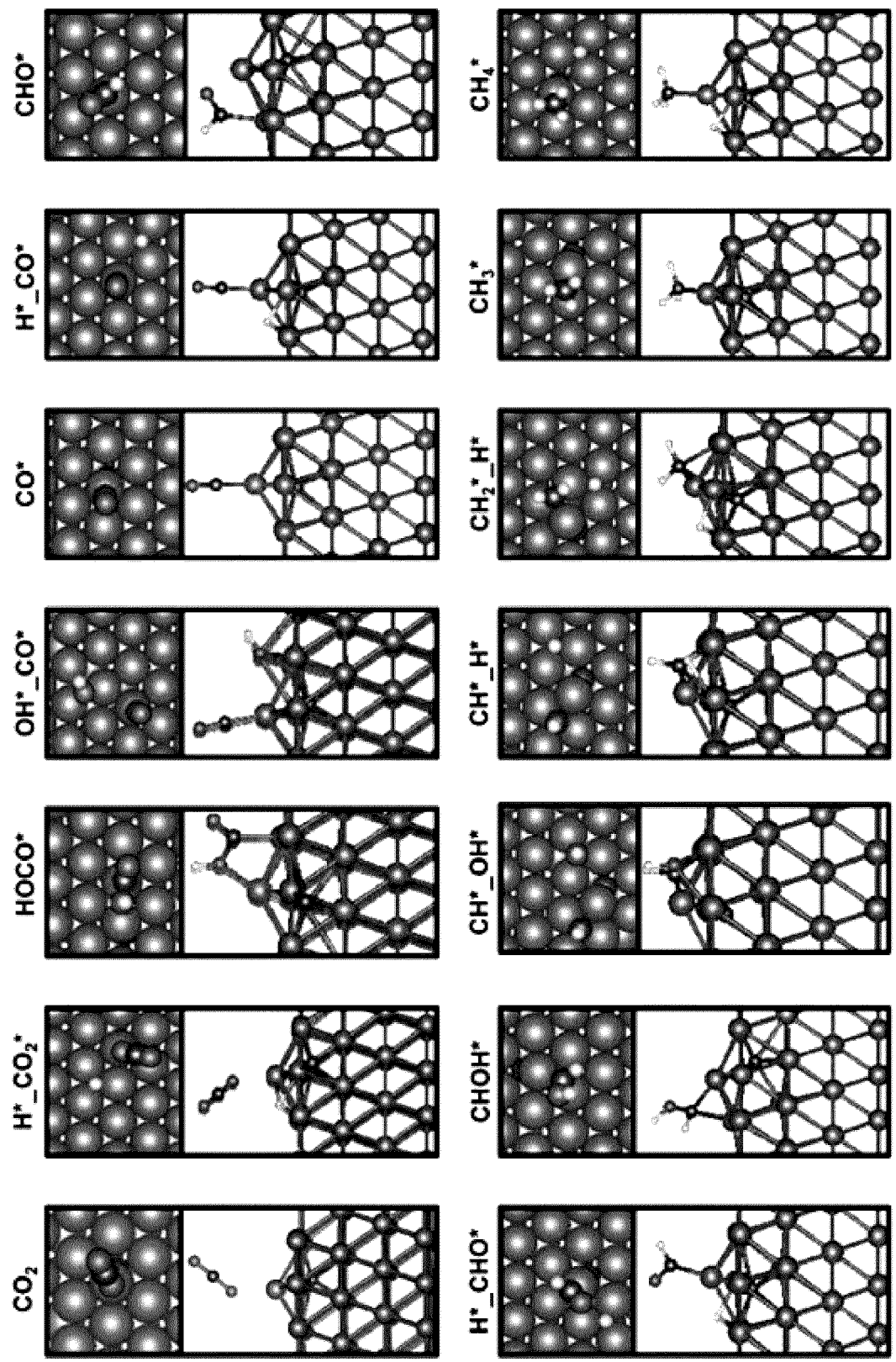
FIG. 6 The optimized geometries for the reaction intermediates during the $CO_2RR$ process to the $CH_4$ product over a B-doped Cu surface with a 1/16 ML concentration of boron.

FIG. 6 shows the optimized geometries for the reaction intermediates during the $CO_2RR$ process to the $CH_4$ product over a B-doped Cu surface with a 1/16 ML concentration of boron.

Figure 7:
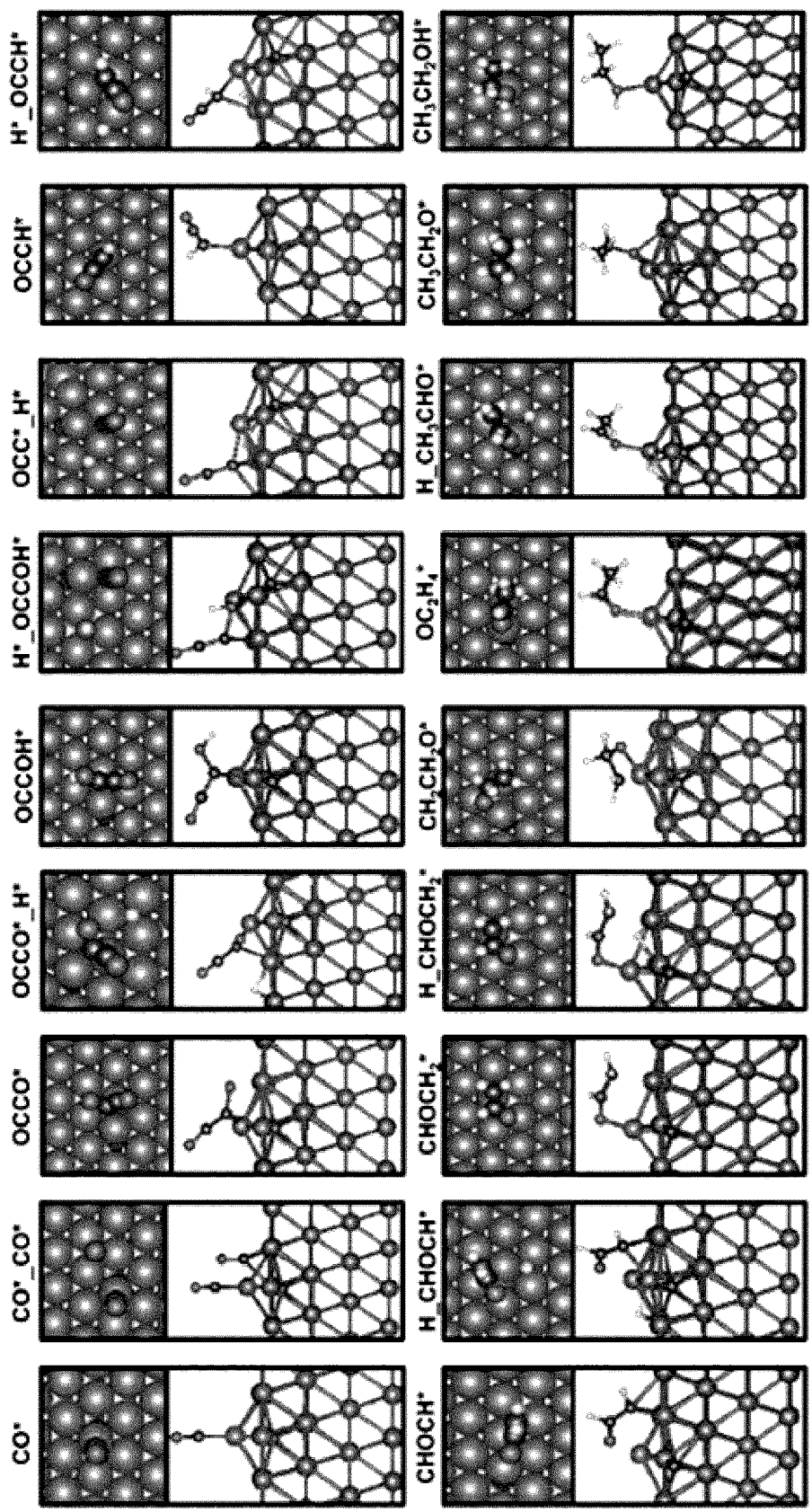
FIG. 7 The optimized geometries for the reaction intermediates during the $CO_2RR$ process to $C_2H_4$ and $C_2H_5OH$ products over a B-doped Cu surface.

FIG. 7 shows the optimized geometries for the reaction intermediates during the $CO_2RR$ process to $C_2H_4$ and $C_2H_5OH$ products over a B-doped Cu surface.

Figure 8:
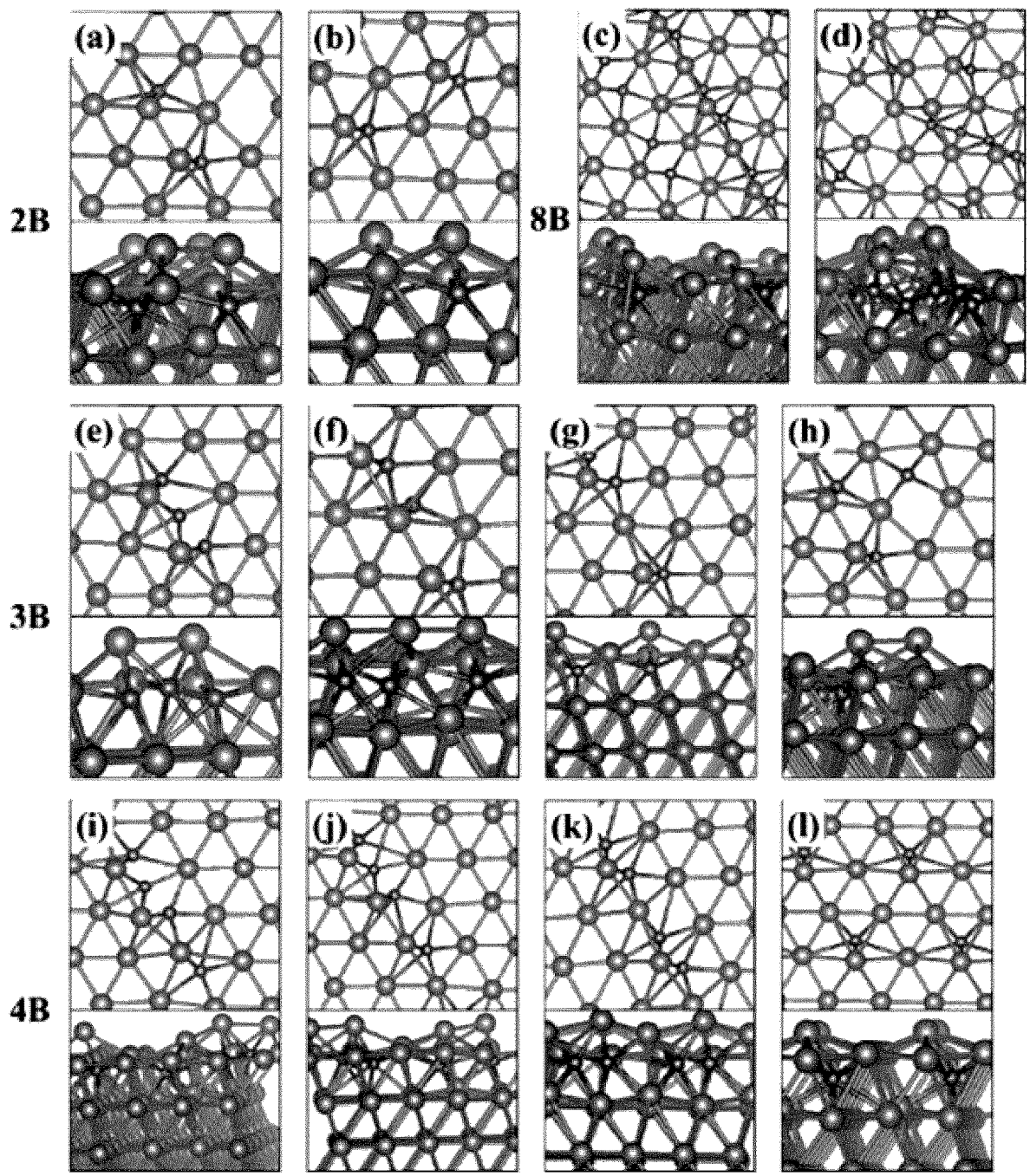
FIG. 8 The optimized Density Functional Theory (DFT) models of the B-doped Cu(111) surfaces with various concentrations of boron at the subsurface.

In addition, the study examined different boron configurations for various concentrations of boron at the subsurface in a Cu(111) slab (i.e., 1[B] (1/16 ML) to 8[B] (1/2 ML), shown in FIG. 8). The energies of each configuration at various boron concentrations are shown in Table 1.

TABLE 1 energy difference between the most favorable configuration of a B-doped Cu(111) surface and other boron sitting configurations at each concentration.

| Boron Concentration | Configuration in FIG. 8 | Energy Difference (eV) |
|---|---|---|
| 2B (1/8 ML) | (a) | 0.00 |
| | (b) | 0.21 |
| 3B (3/16 ML) | (e) | 0.00 |
| | (f) | 1.01 |
| | (g) | 0.62 |
| | (h) | 0.72 |

TABLE 1-continued energy difference between the most favorable configuration of a B-doped Cu(111) surface and other boron sitting configurations at each concentration.

| Boron Concentration | Configuration in FIG. 8 | Energy Difference (eV) |
|---|---|---|
| 4B (1/4 ML) | (i) | 0.00 |
| | (j) | 0.12 |
| | (k) | 0.42 |
| | (l) | 1.38 |
| 8B (1/2 ML) | (c) | 0.00 |
| | (d) | 0.89 |

The study chose the most favorable B-doped Cu(111) surface for the model to examine the reaction pathway as well as energy requirements of the rate-limiting step during the $CO_2RR$ process.

FIG. 8 shows the optimized DFT models of the B-doped Cu(111) surfaces with various concentrations of boron at the subsurface. At each boron concentration, the study examined different boron sitting configurations. Here, 2B, 3B, 4B, and 8B stand for the boron concentration of 1/8 ML, 3/16 ML, 1/4 ML, and 1/2 ML, respectively.

Figure 2:
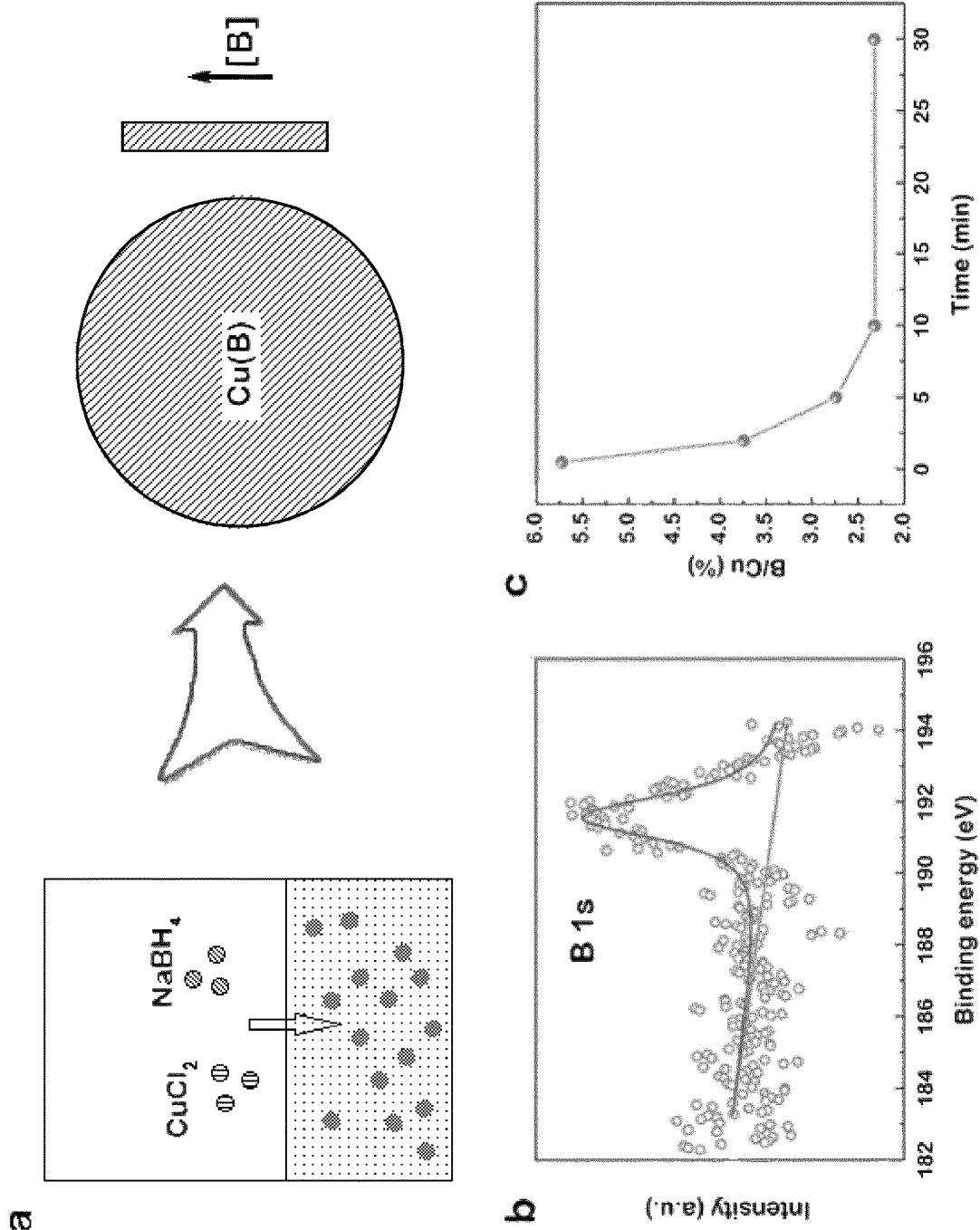
FIG. 2 Preparation and characterization of Cu(B). (a) Schematic view of the wet-chemical process to synthesize Cu(B) samples. (b) Boron XPS spectra and (c) dissolving time-dependent B concentrations of Cu(B) samples measured by ICP-OES.
Figure 15:
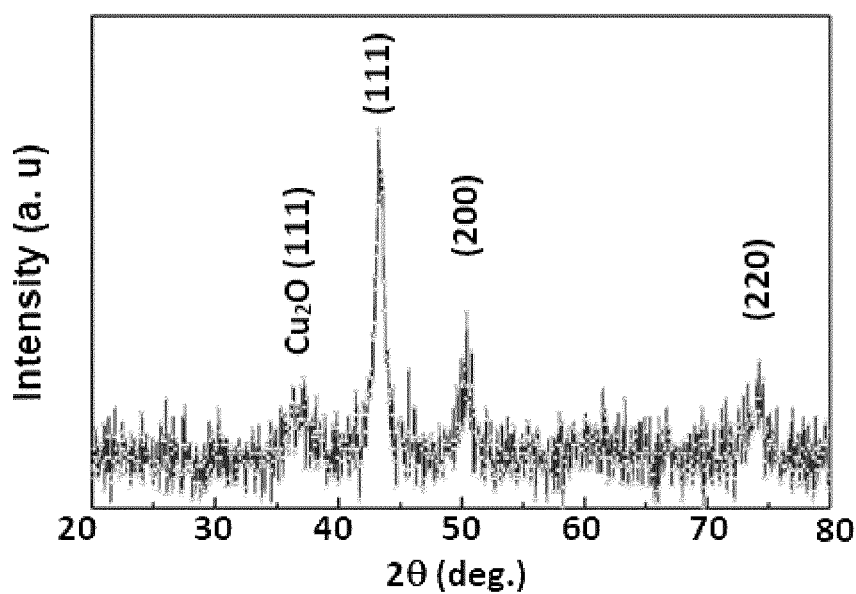
FIG. 15 XRD pattern of Cu(B)-2. The sample is determined to be cubic phase Cu with a dominant (111) peak. A weak peak of $Cu_2O$ is observed due to the oxidation of Cu in air.
Figure 16:
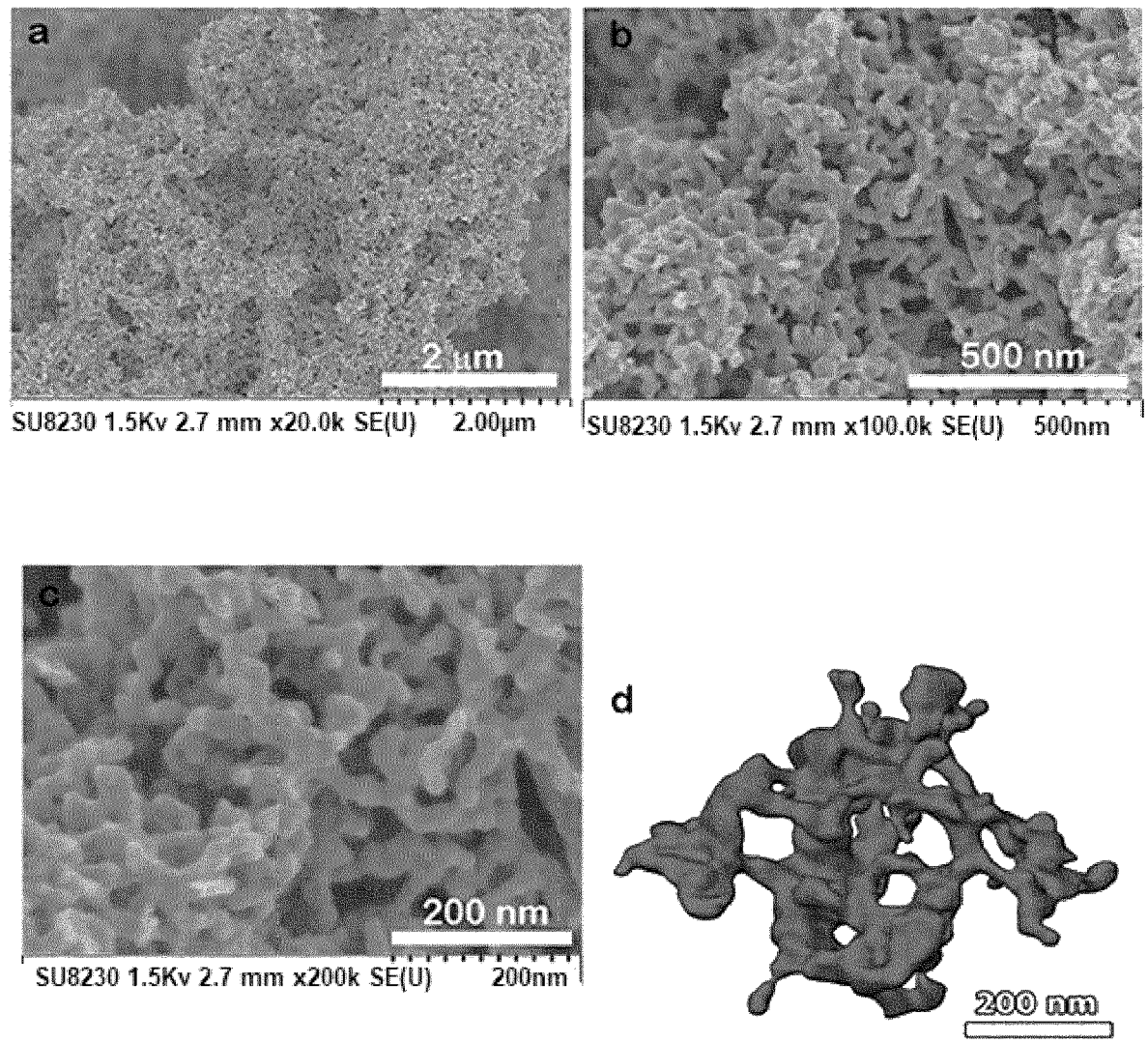
FIG. 16 Electron microscopy images of Cu(B) sample. (a-c) SEM images. (d) 3D TEM image.
Figure 17:
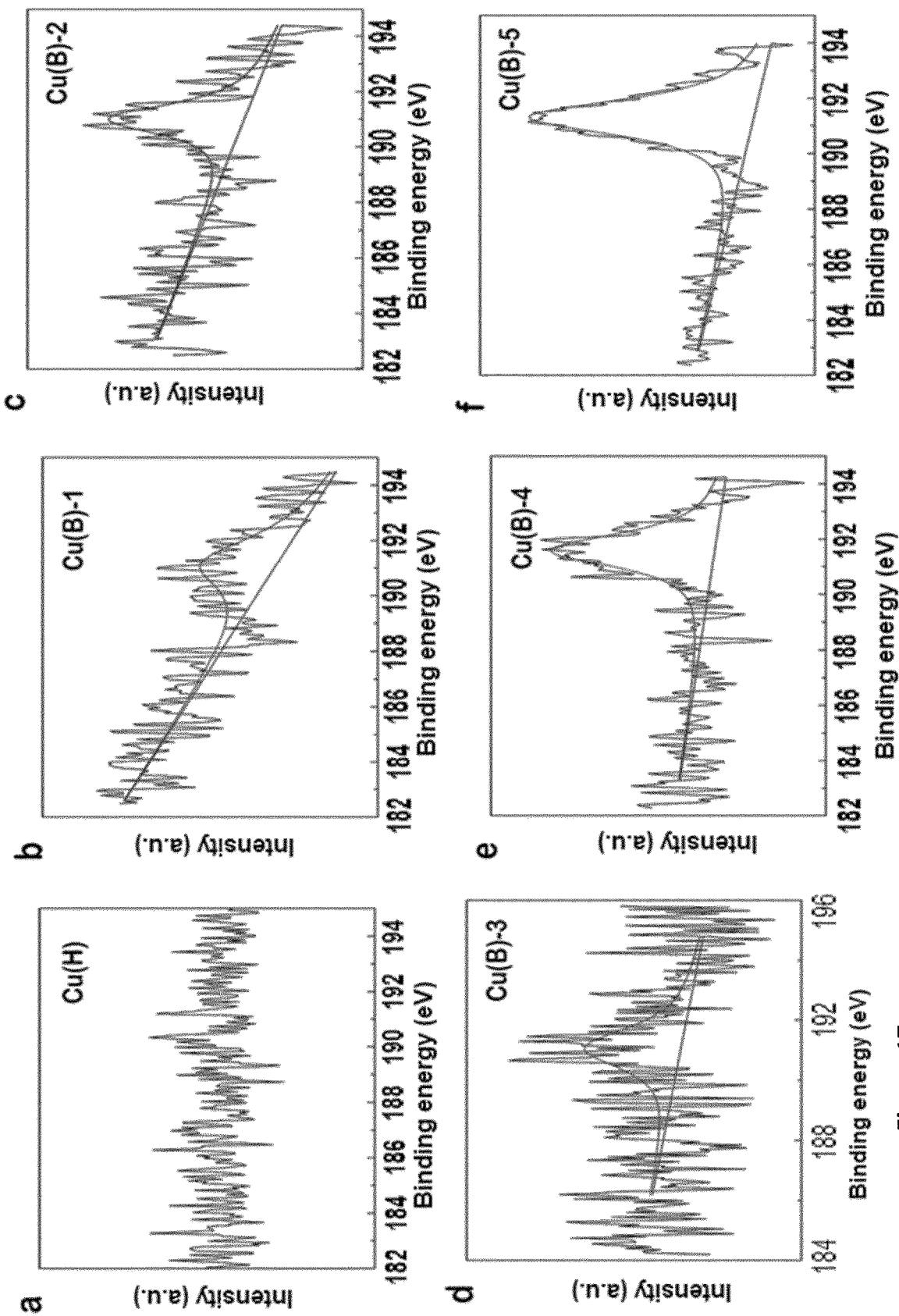
FIG. 17 XPS spectra of B 1s spectra of Cu(H) and Cu(B) samples. (a) Cu(H), (b) Cu(B)-1, (c) Cu(B)-2, (d) Cu(B)-3, (e) Cu(B)-4, (f) Cu(B)-5. B is not detected in the Cu sample prepared using hydrazine hydrate ($N_2H_4$) as reducing reagent rather than $NaBH_4$.
Figure 18:
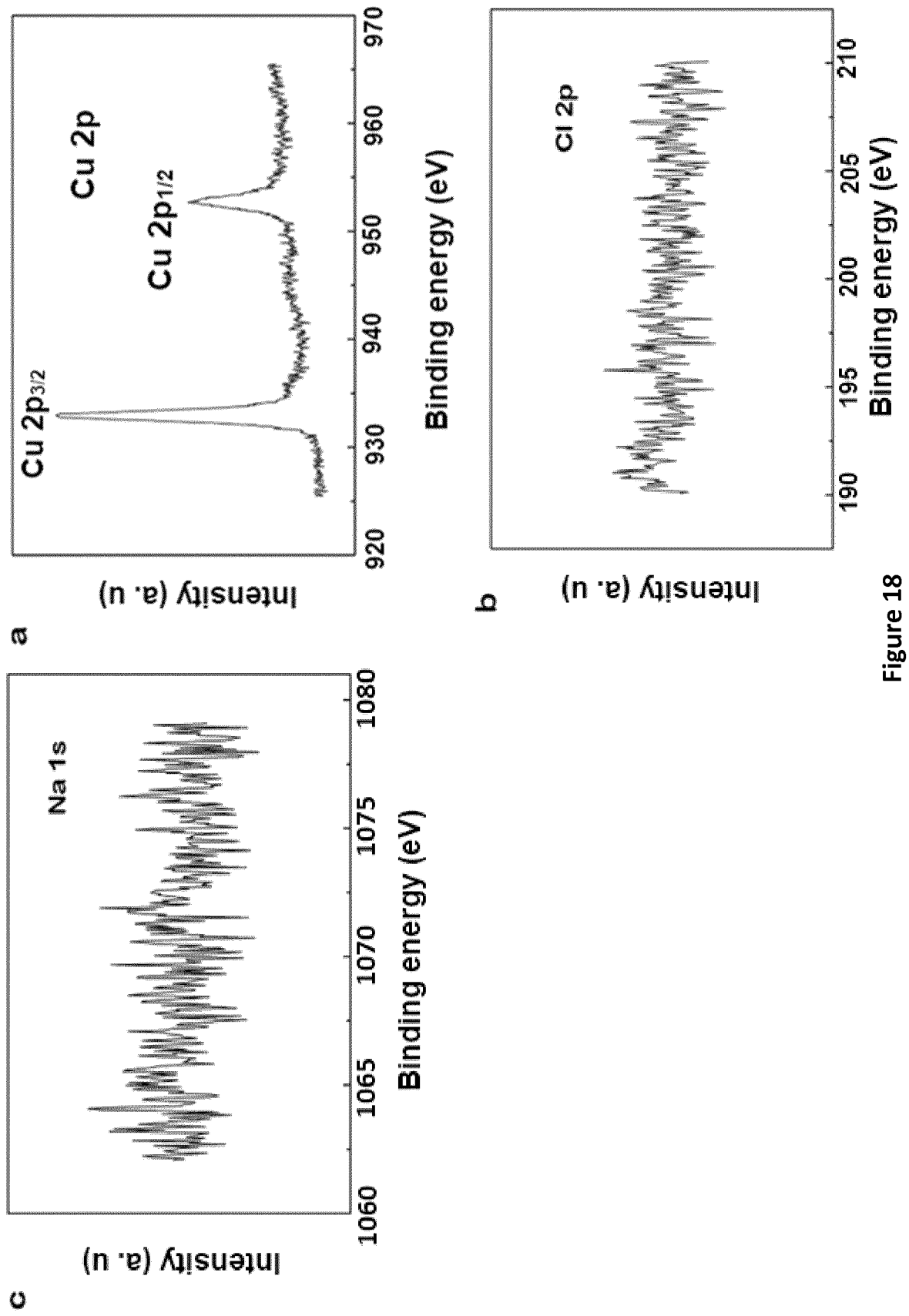
FIG. 18 XPS spectra Cu(B)-2. (a) Cu 2p, (b) Cl 2p and (c) Na 1s.
Figure 19:
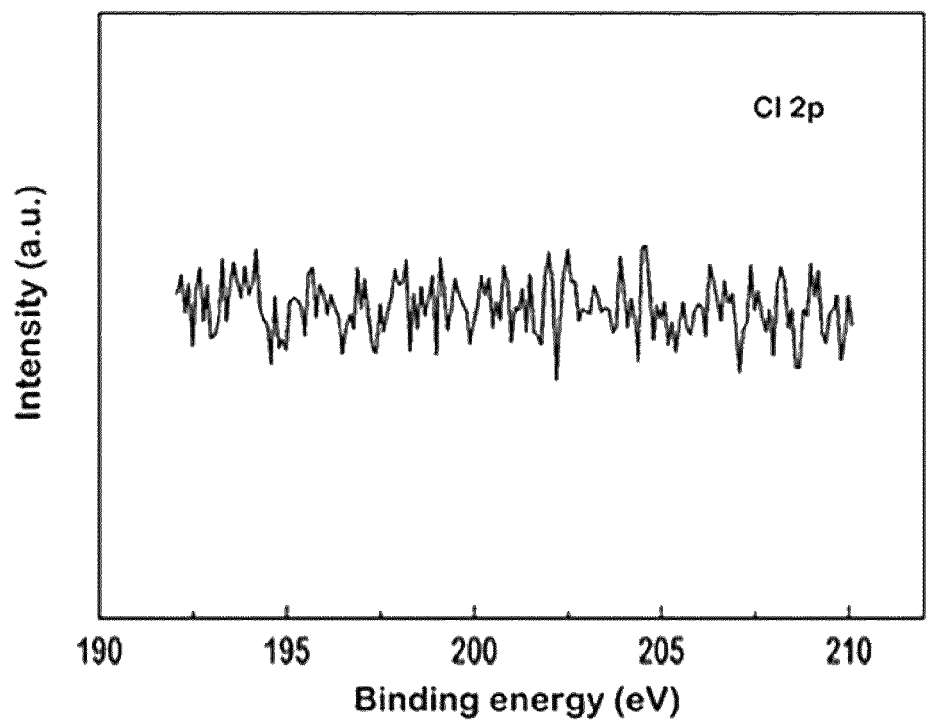
FIG. 19 Cl2p XPS spectra of Cu(B)-2 after $CO_2RR$ in 0.1 M KCl at −1V vs RHE for 3 hours.

In light of these findings, the studies sought to synthesize B-doped Cu (FIG. 2a). The as-synthesized sample is of the cubic Cu phase (JCPDS No. 85-1326) with a dominant (111) peak (FIG. 15). The Cu(B) sample has a porous dendritic morphology with nanostructured features on the scale of 30-40 nm (FIG. 16). The presence of B in Cu(B) samples was confirmed using X-ray photoelectron spectroscopy (XPS) (FIGS. 2b and 17). Other elements including sodium (Na) and chlorine (Cl) were not neither detected before nor after reaction (FIGS. 18 and 19), suggesting that only B is incorporated into Cu. The presence of B in Cu(B) samples was further confirmed using inductively coupled plasma optical emission spectroscopy (ICP-OES) (FIG. 2c). The study found the B concentration inside the Cu samples to be tunable when the amount of $CuCl_2$ in the precursors was different (see below table 2).

TABLE 2

B contents in samples synthesized using different amounts of $CuCl_2$.

| Samples | Cu(B)-1 | Cu(B)-2 | Cu(B)-3 | Cu(B)-4 | Cu(B)-5 |
|---|---|---|---|---|---|
| $CuCl_2$ (mg) | 400 | 300 | 200 | 100 | 25 |
| B/Cu (%) | 1.3 | 1.7 | 1.9 | 2.0 | 2.2 |

Figure 20:
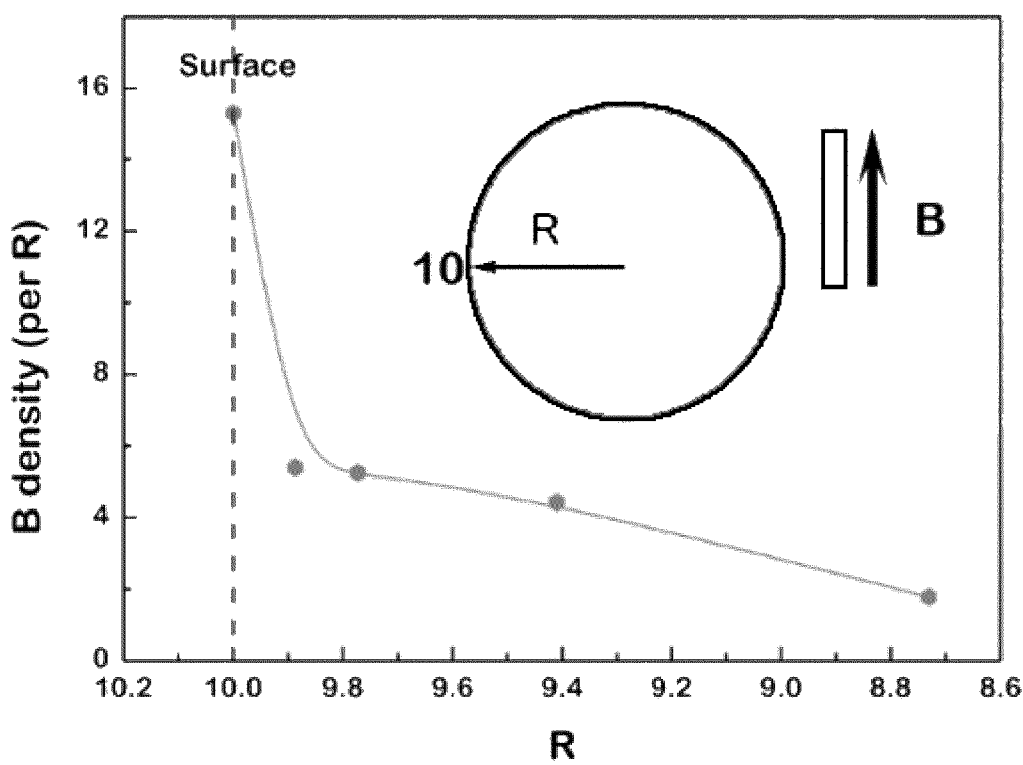
FIG. 20 B distribution in Cu(B) sample. B distribution model based on the dissolving time-dependent ICP results in FIG. 1d.

The study sought to probe the distribution, as a function of depth within the Cu-based catalyst, of the incorporated B. The study employed time-dependent ICP-OES (FIG. 2c) which revealed that the B concentration drops from 5.7% (B/Cu atomic ratio) to 2.7% over an estimated depth of 7.5 nm. The study found that the B concentration is highest within 2.5 nm of the surface of the Cu catalyst (FIG. 20).

Example 3: Calculation of the Bader Charge Analysis

Furthermore, when the study calculated the Bader charge analysis, the study applied a fast Fourier transform (FFT) grid that was twice as dense as the standard FFT grid to ensure that the Bader charge results were fully converged.

DFT studies establish B doping as a candidate to modify Cu in light of its adsorption behavior on the Cu(111) surface (FIGS. 1 and 8). By a margin of 0.78 eV, it is more favourable for B to diffuse into the subsurface of a Cu(111) slab than it is for it to on the surface (FIG. 1a). In addition to the boron modified Cu(111) surface, the present invention also computationally examines the B-doped Cu(100) surface (FIG. 11), the more thermodynamically favorable surface for producing $C_2$ product during $CO_2RR$. The results show that the subsurface sites are more favorable than the top or bridge adsorption sites. In contrast, oxygen is (by a margin of 1.5 eV) adsorbed on the Cu(111) surface rather than diffusing into the subsurface. Together these findings indicate that B doping can offer a strategy for stable modulation of the Cu catalyst.

The present invention queried the projected density of states (PDOS) of Cu3d and C2p and carried out Bader charge analysis to investigate the electronic properties of B-doped Cu. When B is doped into the subsurface of the Cu slab, it exhibits a higher overlap among binding states between C2p and Cu 3d when is CO adsorbed on the surface compared to pristine Cu, leading to a stronger binding energy of CO over a B-doped Cu surface. The d-band center of the nearby Cu atom shifts away from the Fermi level compared to pristine Cu. This indicates that Cu atoms adjacent to B are more positively charged (FIG. 1a). The PDOS result agrees with Bader charge analysis: Cu transfers electrons to B, resulting in a positively-charged Cu oxidation state, indicating that the changes in the oxidation state of Cu include the interaction between B and Cu as well as the surface geometrical changes. Consequently, the B-doped Cu (Cu(B)) system has both $Cu_{\delta+}$ and $Cu^0$ regions, exhibiting a motif analogous to the $Cu_2O/Cu$ catalyst reported by Goddard et al, in Xiao H, Goddard W A, 3rd, Cheng T, Liu Y. Cu metal embedded in oxidized matrix catalyst to promote $CO_2$ activation and CO dimerization for electrochemical reduction of $CO_2$. Proc. Natl. Acad. Sci. U.S.A. 2017, 114(26): 6685-6688.

Example 4: Simulation of Gibbs Energy to Study Two Key Reaction Pathways

Figure 13:
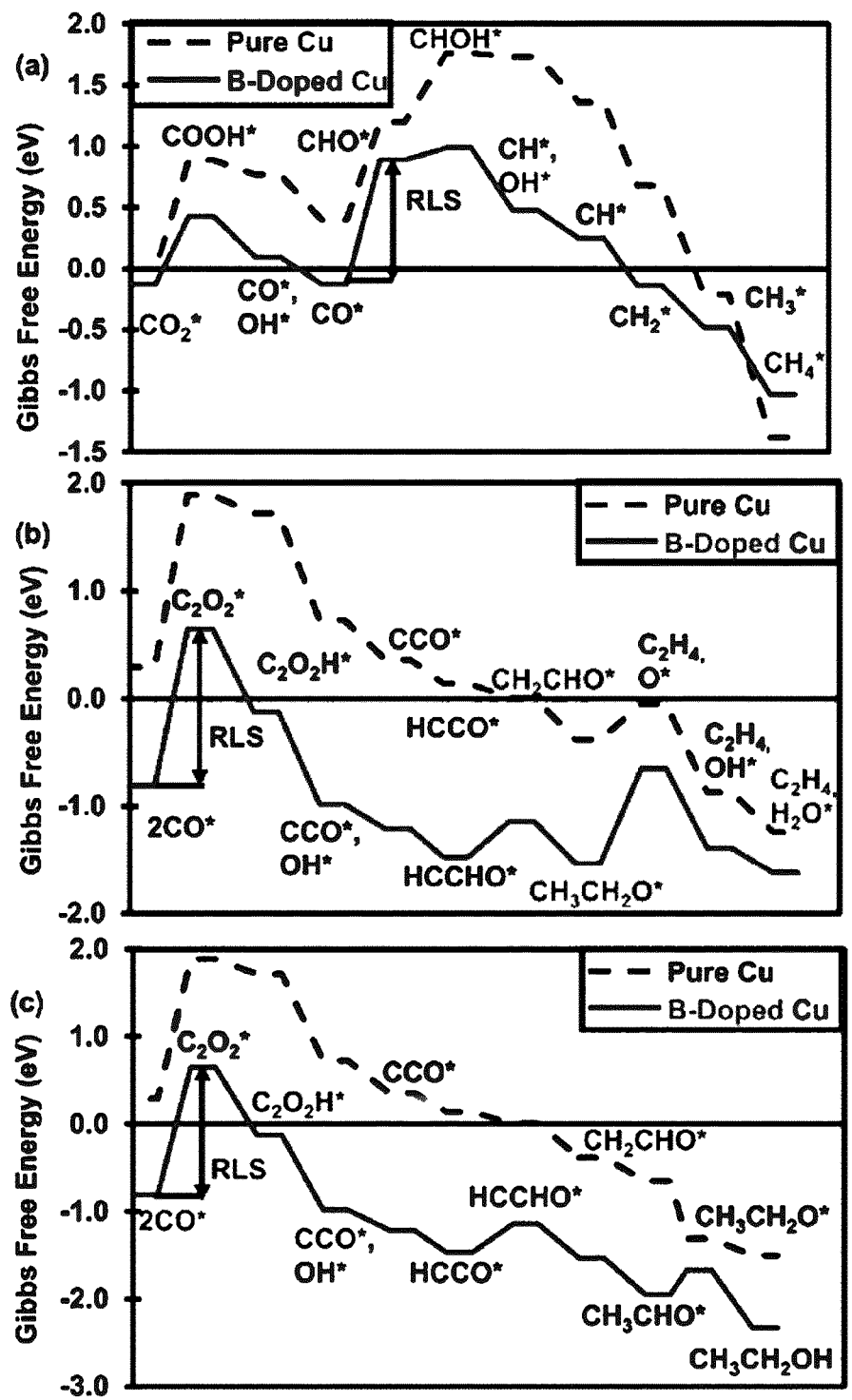
FIG. 13 DFT calculations on reaction energy diagrams for $CO_2$ conversion to $CH_4$ (a), $C_2H_4$ (b) and $C_2H_5OH$ (c) on a pure Cu(111) surface and a B-doped Cu(111) surface (with a 1/16 ML subsurface concentration of boron).

The present invention simulated the Gibbs free energy of two key reaction pathways for the catalyst comprised of B-doped Cu (1/16 monolayer (ML)) (FIG. 13). The present invention compared $CO_2$ reduction to $C_1$ (e.g. methane) versus $C_2$ products (e.g. $C_2H_4$ and $C_2H_5OH$) at 298 K and 1 atm. The B dopant greatly suppresses the reaction path of $CO_2 \rightarrow C_1$ by increasing the reaction energy requirements for the (rate-limiting) CO*+H*→CHO* step. It enhances $CO_2 \rightarrow C_2$, decreasing the reaction energy required for its rate-limiting CO*+CO*→OCCO* step.

The study proceeded to tune the partial Cu oxidation state from −0.1 e to +0.3 e by varying Cu facets (i.e. Cu(100), Cu(111), Cu(110), Cu(211)), changing the concentration of B dopants (from 1/16 ML to 1/2 ML, as shown in FIG. 8), and providing a range of applied external electric fields (FIG. 1b). The CO adsorption energy increases monotonically as the Cu oxidation state is increased. A volcano plot of the energy for the CO═CO dimerization (the rate-limiting step for $CO_2 \rightarrow C_2$) as a function of the average CO adsorption energy $$\left(E_{ad_{avg}} = \frac{E_{ad}(CO_{1st}) + E_{ad}(CO_{2nd})}{2}\right)$$

(FIG. 1c) indicates that—per the Sabatier principle—optimized averaged binding energies (~0.8-1.0 eV) of two CO molecules improve CO═CO dimerization and thus support the generation of $C_2$ products. When the study applied a range of external electric fields and charged the surface via the Neugebauer and Scheffler method, it was found that the volcano plot of the CO═CO dimerization retains its profile and overall trends (FIG. 12). Furthermore, when the optimal averaged binding energies of two CO molecules are achieved, a larger difference in the adsorption energies of these two CO molecules ($\Delta E_{ad}=|E_{ad}(CO_{1st})-E_{ad}(CO_{2nd})|$) further enhances CO═CO dimerization (FIG. 1d). To increase $C_2$ production during the $CO_2RR$ process, an optimal average oxidation state (~$\delta^{0.2+}$) for Cu is desired and is driven by providing a local admixture of two different oxidation states of Cu ($\delta^0$ and $\delta^+$). The studies found similar results on the (100) surface whereby B-doped Cu has a higher propensity to form C2 products compared to pristine Cu (see FIG. 11). Taken together, these computational simulations point towards boron doping as a viable strategy to enhance Cu properties towards C2 production.

Example 4: Effect of a Subsurface Boron Atom

In FIG. 1(d) in the main manuscript, the adsorption energy of a CO molecule over a Cu surface in the presence and absence of boron dopants was calculated by Equation (S1):

$$E_{ad}=-E_{(CO/slab)}+E_{(slab)}+E_{(CO(gas))} \quad (S1)$$

where $E_{(CO/slab)}$ represents the total energy for a CO molecule over the Cu slab; $E_{(slab)}$ is the total energy of the bare slab and $E_{(CO(gas))}$ is the carbon monoxide gas phase energy. Here, the more positive value of the adsorption energy represents a stronger binding strength of the CO molecule. Moreover, the reaction energy of the CO═CO dimerization was given by Equation (S2):

$$\Delta H_{rxn}=E_{(OCCO*)}-E_{(2CO*)} \quad (S2)$$

where $E_{(OCCO*)}$ represents the total energy for a OCCO* intermediate over the slab; $E_{(slab)}$ is the total energy of the co-adsorption of two CO molecules over the slab.

Figure 9:
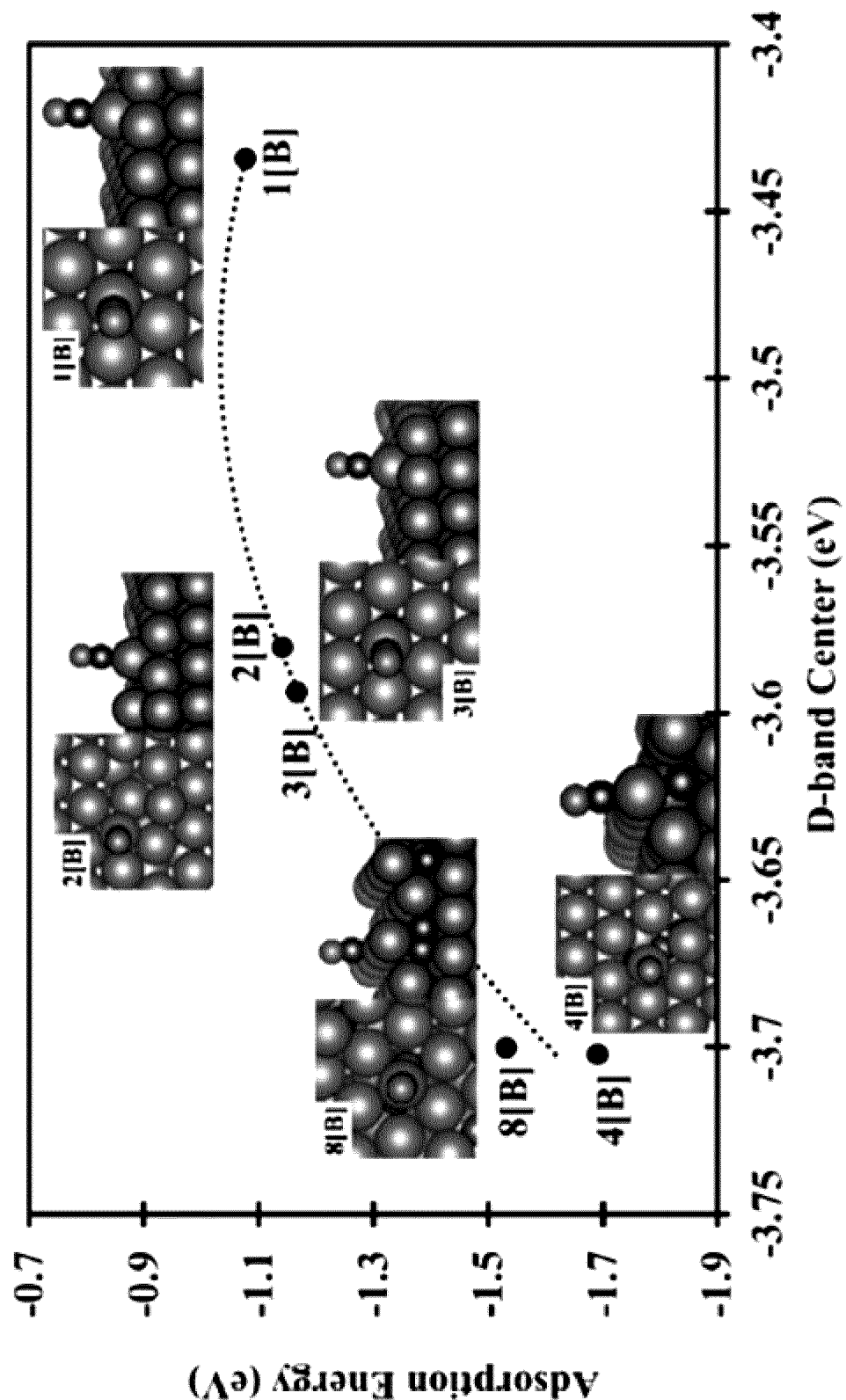
FIG. 9 The adsorption energy of CO adsorbates over a B-doped Cu (111) surface as a function of d-band center of the adsorbed Cu atom.
Figure 10:
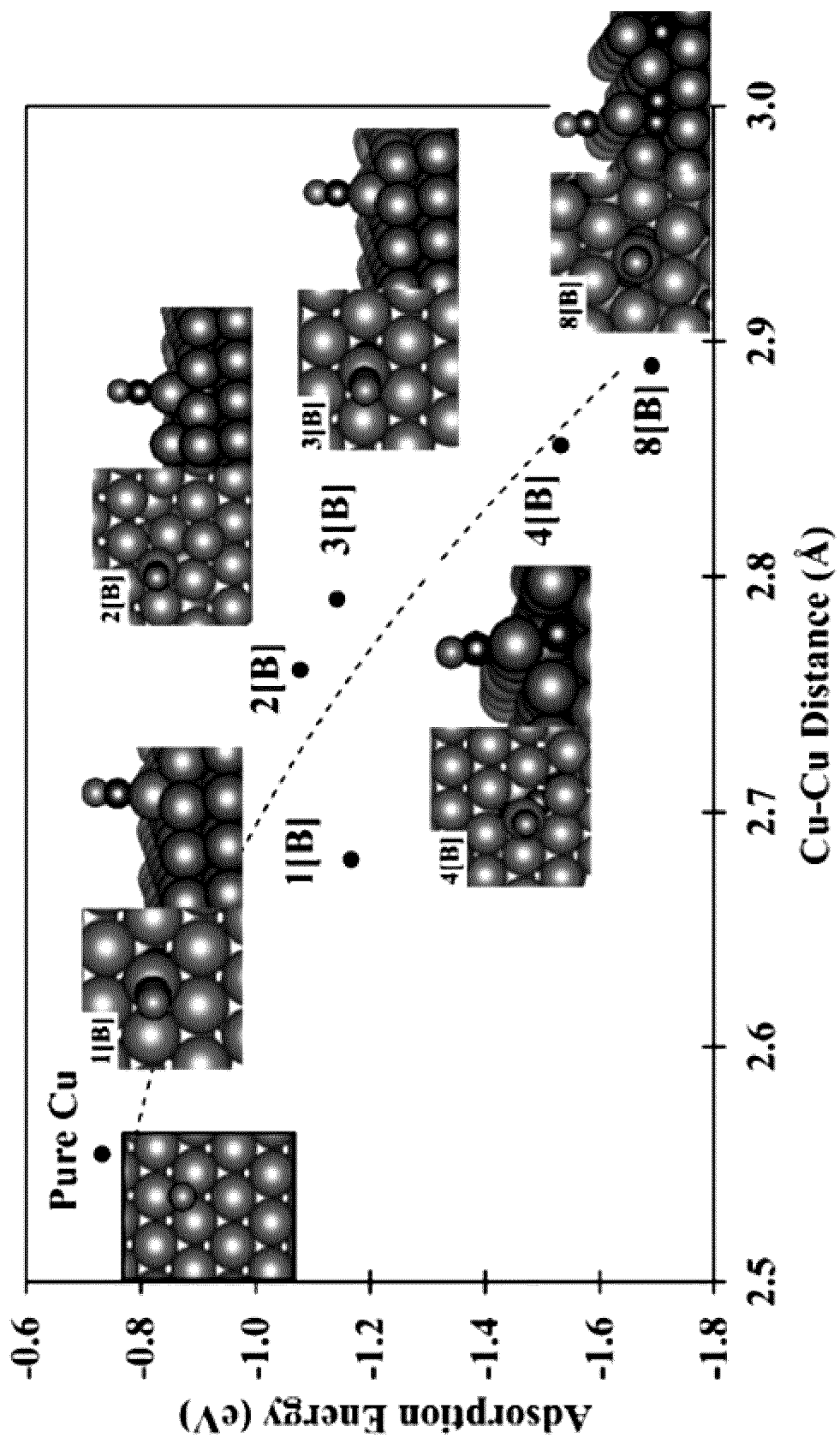
FIG. 10 The adsorption energy of CO adsorbates over a B-doped Cu(111) surface as a function of the average Cu—Cu distance on the surface.

The subsurface boron atom plays two significant roles in altering the CO adsorption energy by changing adjacent Cu valence band of states (as shown in FIG. 9); and by changing the coordination number of nearby Cu (as shown in FIG. 10). The results (FIG. 10) show that the Cu—Cu distance increases as the number of boron atom dopants increases, leading to stronger CO adsorption. The results suggest that by carefully controlling the degree of subsurface boron, and thus Cu undercoordination, the optimal average adsorption range of CO may be tuned (see FIG. 1(c) and 1(d)).

FIG. 9 shows the adsorption energy of CO adsorbates over B-doped Cu (111) surfaces as a function of d-band center of the adsorbed Cu atom. The d-band center of the adsorbed Cu atom changes as a function of doped boron. Here, 1[B] to 8[B] stands for 1/16 ML of subsurface boron to 1/2 ML of subsurface boron in a Cu (111) surface.

FIG. 10 shows the adsorption energy of CO adsorbates over a B-doped Cu(111) surfaces as a function of the average Cu—Cu distance on the surface. The Cu—Cu distance is an effective descriptor for the coordination number of Cu, in which a longer Cu—Cu distance represents more undercoordinated Cu atoms. Here, 1[B] to 8[B] stand for 1/16 ML of subsurface boron to 1/2 ML of subsurface boron in a Cu(111) surface.

Example 5 Stability of Boron at Different Sites on a Cu(100) Surface

For generating $C_2$ products during $CO_2RR$, the most active and Cu catalytic surface has been shown to be Cu(100). Thus, the study also examined the Cu(100) surface with boron dopants. The results show that the B atom adsorption at the four-fold hollow site in a Cu(100) surface is the most favorable configuration, which is 2.61 eV, 1.77 eV, and 1.04 eV more stable than the scenarios of the top, bridge and subsurface sites, respectively (FIG. 13). It can be noted that the subsurface sites are more favorable than the top or bridge adsorption sites.

Figure 11:
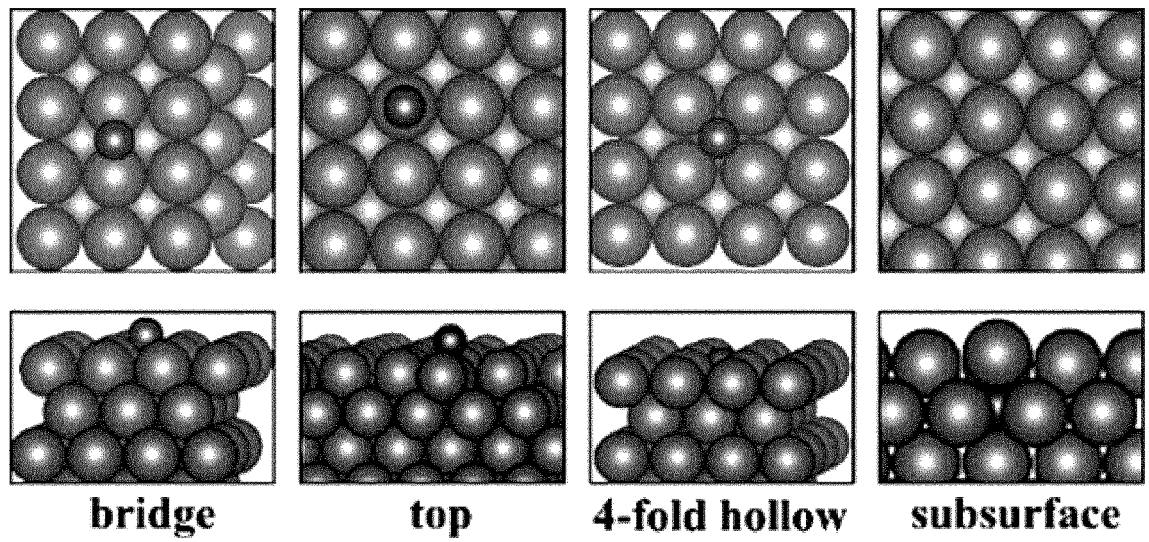
FIG. 11 The DFT model of a Cu(100) surface with boron dopants adsorption at various locations.
Figure 12:
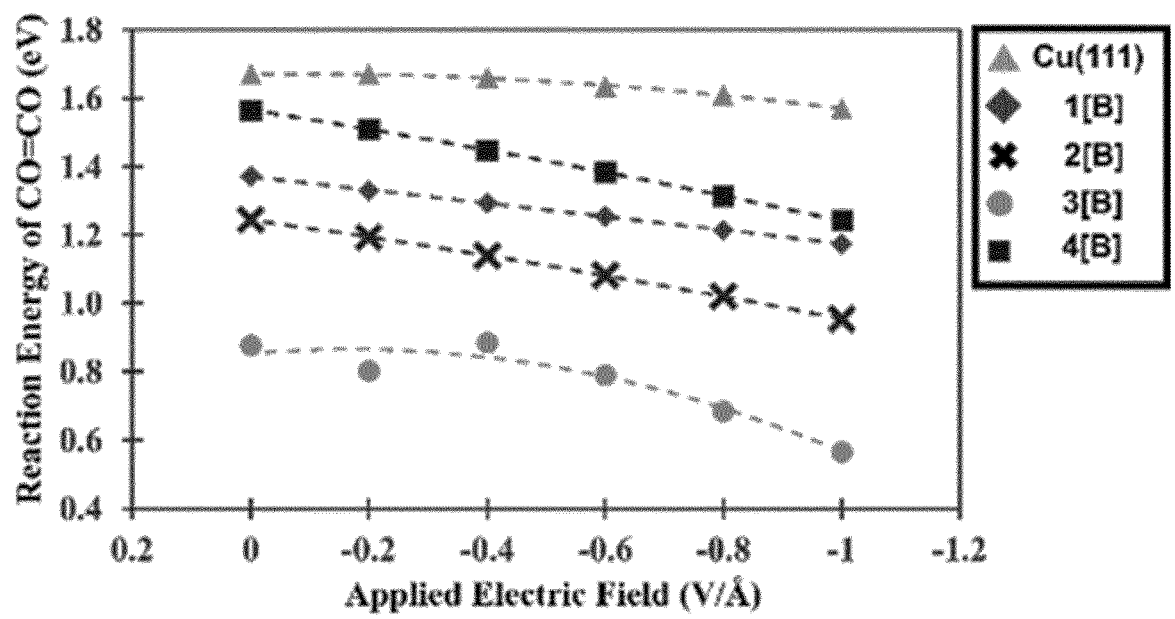
FIG. 12 The applied field effects on the reaction energies of the CO═CO coupling step over a pure Cu(111) surface as compared to a B-doped Cu(111) surface with various boron concentrations.

FIG. 11 shows the DFT model of a Cu(100) surface with boron dopants adsorption at various locations.

Example 6: The Whole Reaction Path of $CO_2RR$ Over Cu(111) and B-Doped Cu(111) Surfaces In FIG. 13, the study considered the whole reaction pathway for generating $C_2$ products from $CO_2RR$ over a B-doped Cu(111) surface (1/16 ML boron at the subsurface) and a pure Cu(111) surface. This can validate the assumption that the rate-limiting step of $CO_2RR$ is still the CO=CO coupling even in the presence of the subsurface boron atom. Therefore, to save the computational time and simplify the DFT calculations, for other boron concentrations, the study only considered the reaction energy requirement for the rate-limiting step of CO=CO coupling with various boron concentrations.

FIG. 13 shows DFT calculations on reaction energy diagrams for $CO_2$ conversion to $CH_4$ (a), $C_2H_4$ (b) and $C_2H_5OH$ (c) on a pure Cu(111) surface and a B-doped Cu(111) surface (with 1/16 ML subsurface concentration of boron).

Example 7: The Applied Electric Fields and Charging Surface Effects on the CO Dimerization Previous methods to simulate electric fields and charging effects have been explored by Goodpaster, Norskov, Goddard, Neurock, and others.

In the present study, the Neugebauer and Scheffler method was applied to include an applied electric field (0 to −1 V/Å)$^{12}$ and charged the surface to examine how an applied electric field may influence the CO dimerization in the presence and absence of various boron dopant concentrations.

As shown in FIG. 12, after accounting for applied electric field effects and charging the surface, the CO dimerization reaction energies monotonically decrease as the applied field is increased from 0 to 1 V/Å. This suggests that with various external applied fields and surface charging effects, the 'volcano plot' of the CO dimerization (FIG. 1(c)) will also shift monotonically but the overall trend will remain. Therefore, the conclusion (subsurface boron will enhance the electrochemical production of $C_2$ during $CO_2RR$) will hold true including the presence of an applied potential effect.

FIG. 12 shows the applied field effects on the reaction energies of the CO=CO coupling step over a pure Cu(111) surface as compared to a B-doped Cu(111) surface with various boron concentrations. Here, 1[B] to 4[B] stands for the subsurface boron concentrations from 1/16 ML to 1/4 ML.

Example 8 One Alternative Rate-Limiting Step of the CC Coupling: CO—COH

As suggested previously, Cu is the only pure metal exhibiting reduction to form hydrocarbon chemicals, and the most favorable surface is Cu(111). For Cu(111), Xiao et al. (in Xiao H, Cheng T, Goddard W A, 3rd, Sundararaman R. Mechanistic Explanation of the pH Dependence and Onset Potentials for Hydrocarbon Products from Electrochemical Reduction of CO on Cu (111). J. Am. Chem. Soc 2016, 138(2): 483-486) predicted the atomistic mechanisms underlying electrochemical reduction of CO, finding that at neutral pH, the $C_1$ and $C_2$ ($C_3$) pathways share the COH common intermediate, where the branch to C—C coupling is realized through a novel CO—COH pathway. And at high pH, early C—C coupling through adsorbed CO dimerization dominates, suppressing the $C_1$ pathways by kinetics, thereby boosting selectivity for multi-carbon products. Based on this study's experimental conditions, the local pH of our reaction is neutral or higher than 7. Thus, besides the CO dimerization reaction to form $C_2$ products, the study also examined the reaction energy for the CO—COH coupling with various boron concentrations as an alternative rate-limiting step of $CO_2RR$ to $C_2$ products here.

Figure 14:
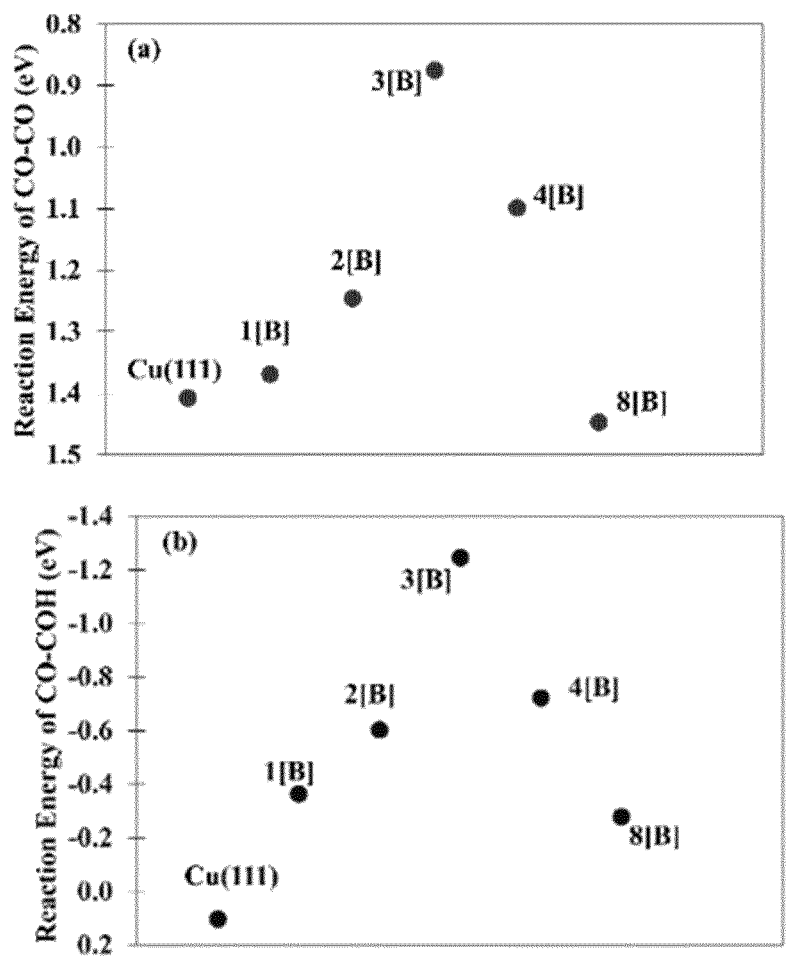
FIG. 14 The most favorable reaction energies of the possible rate-limiting step of the CO dimerization (a) and an alternative rate-limiting step of the CO—COH coupling (b) over a Cu(111) surface with various boron dopant concentrations.

As shown in FIG. 14, the study examined the most favorable reaction energy for the CO—COH coupling with various boron dopant concentrations in a Cu(111) slab. The DFT results show that the trend of the reaction energy of the CO—COH coupling as a function of various boron dopant concentrations is similar to the scenario of the CO dimerization. Therefore, the boron dopants can significantly enhance the Cu performance for generating $C_2$ products during the $CO_2RR$ process.

FIG. 14 shows the most favorable reaction energies values of the possible rate-limiting step of the CO dimerization (a) and an alternative rate-limiting step of the CO—COH coupling (b) over a Cu(111) surface with various boron dopant concentrations.

Example 9 Formation Energy of the Reaction-Involved Intermediates

This example reports the calculated formation energies or reaction energies of the $CO_2RR$ to $C_1/C_2$ reaction-involved intermediates at various adsorption sites over a Cu(111) surface both in the absence and presence of boron. The operatized geometries for the reaction intermediates at their most favorable adsorption sites during the $CO_2RR$ process to $C_1$ and $C_2$ products over a B-doped Cu surface are presented in FIG. 6 and FIG. 7. The formation energy $$\left( E_{ad_{CH_yO_z^*}} \right)$$

of various reaction intermediates during the $CO_2RR$ to $C_1$ products over a Cu catalyst in the presence and absence of boron is given by:

$$CO_2(gas) + xH^* \leftrightarrow CH_yO_z^* + (2-z)H_2O(gas) + (x-1)^* \quad (S4)$$

$$E_{f_{CH_yO_z^*}} = \quad (S5)$$
$$E(CH_yO_z^*) + (2-z)E_{H_2O(gas)} + (x-1)E_{slab} - E_{CO_2(gas)} - xE(H^*)$$

where $E(CH_yO_z^*)$ and $E(H^*)$ represent the total energy for a $CH_yO_z^*$ and an $H^*$ intermediate over the Cu slab in the presence and absence of boron; $E_{(slab)}$ is the total energy of the bare slab and $E_{H_2O(gas)}$ and $E_{CO_2(gas)}$ are the carbon dioxide and water gas phase energy. All the C1 formation energies over a Cu surface with and without boron are presented in Table 3 and 4.

Table 3 shows the formation energy of the CO₂RR to C₁ reaction-involved intermediates at various adsorption sites over a Cu(111) surface.

TABLE 3 formation energy of the CO₂RR to C₁ reaction-involved intermediates at various adsorption sites over a Cu(111) surface.

| Species | Adsorption Sites | Formation Energy (eV) |
|---|---|---|
| CO₂ | top | −0.02 |
| COOH | top(cis) | 0.59 |
|  | top(trans) | 0.60 |
| CO | top | 0.60 |
|  | fcc | 0.39 |
|  | hcp | 0.29 |
| CHO | top | 0.30 |
|  | fcc | 1.05 |
|  | hcp | 1.02 |
| CHOH | top | 1.10 |
|  | hcp | 1.42 |
|  | fcc | 1.24 |
| CH | hcp | 1.24 |
| CH₂ | hcp | 2.20 |
| CH₃ | fcc | 0.48 |
| CH₄ | top | −0.58 |

Table 4 shows the formation energy of the CO₂RR to C₁ reaction-involved intermediates at various adsorption sites over a B-doped Cu(111) surface.

TABLE 4 formation energy of the CO₂RR to C₁ reaction-involved intermediates at various adsorption sites over a B-doped Cu(111) surface.

| Species | Adsorption Sites | Formation Energy (eV) | Species | Adsorption Sites | Formation Energy (eV) |
|---|---|---|---|---|---|
| CO₂ | top | −0.15 | CHO | fcc | 1.11 |
| COOH | fcc_nearB | 0.24 |  | fcc_nearB | 0.68 |
|  | top_nearB | 0.21 | CHOH | fcc_nearB | 1.20 |
|  | topB | 0.25 |  | hcp_nearB | 1.20 |
|  | top | 0.59 |  | topB | 1.16 |
| CO | top | 0.47 | CH | hcp_nearB | 1.06 |
|  | fcc | 0.34 |  | topB | 0.97 |
|  | hcp | 0.37 |  | hcp_nearB | 0.82 |
|  | fcc_nearB | 0.26 |  | topB | 0.49 |
|  | hcp_nearB | 0.32 |  | fcc_nearB | −0.42 |
|  | topB | −0.07 |  | topB | −0.54 |
| CHO | topB | 0.86 |  | hcp_nearB | 0.04 |
|  | hcp | 0.69 |  | topB | −1.13 |
|  |  |  |  | fcc_nearB | −0.95 |

In addition, for the formation energy of

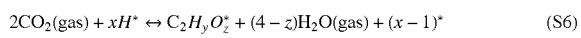

of various reaction intermediates during the CO₂RR to C₂ products over a Cu catalyst in the presence and absence of boron is given by:

$$2CO_2(gas) + xH^* \leftrightarrow C_2H_yO_z^* + (4-z)H_2O(gas) + (x-1)^* \quad (S6)$$

$$E_{ad_{C_2H_yO_z^*}} = E(C_2H_yO_z^*) + (4-z)E_{H_2O(gas)} + (x-1)E_{slab} - 2E_{CO_2(gas)} - xE(H^*) \quad (S7)$$

where $E(C_2H_yO_z^*)$ represents the total energy for the adsorbed $C_2H_yO_z^*$ species. All the C₂ formation energies over a Cu surface with and without boron are presented in Table 5 and 6.

Table 5 shows the formation energy of the CO₂RR to C₂ reaction-involved intermediates at various adsorption sites over a Cu(111) surface.

TABLE 5

Formation energy of the CO₂RR to C₂ reaction-involved intermediates at various adsorption sites over a Cu(111) surface.

| Species | Adsorption Sites | Formation Energy (eV) | Species | Adsorption Sites | Formation Energy (eV) |
|---|---|---|---|---|---|
| OCCO | top | 2.19 | CH₂CHO | bri | −0.45 |
|  | fcc | 1.98 |  | top | −0.52 |
|  | hcp | 2.05 | OC₂H₄ | top | −0.36 |
| OCCOH | top | 1.55 | CH₃CHO | bri | −1.06 |
|  | hcp | 1.59 |  | fcc | −1.06 |
|  | fcc | 1.55 |  | top | −1.06 |
| CCO_H | hcp | 0.54 | CH₃CH₂O | top | −1.67 |
| HCCO | hcp | 0.26 |  | fcc | −1.69 |
| HCCHO | bri | 0.00 |  | bri | −1.71 |
|  | hcp | 0.00 | CH₃CH₂OH | bri | −1.97 |

Table 6 shows the formation energy of the CO₂RR to C₂ reaction-involved intermediates at various adsorption sites over a B-doped Cu(111) surface.

TABLE 6 formation energy of the CO₂RR to C₂ reaction-involved intermediates at various adsorption sites over a B-doped Cu(111) surface.

| Species | Adsorption Sites | Formation Energy (eV) | Species | Adsorption Sites | Formation Energy (eV) |
|---|---|---|---|---|---|
| OCCO | hcpB | 0.51 | CH₂CHO | fcc | 0.42 |
|  | top_nearB | 1.72 |  | top | −0.51 |
| OCCOH | Bhcp | 1.33 |  | top_nearB | −0.57 |
|  | Btop | 1.59 | OC₂H₄ | top_b | −0.15 |
|  | B_bri | 1.37 |  | hcp | −0.18 |
| CCO_H | fcc_fcc | 0.56 |  | top | 0.65 |
|  | fcc_hcp | 0.55 |  | fcc | −0.19 |
|  | top_fcc | 2.31 | CH₃CHO | FS | −1.01 |
|  | top_hcp | 2.29 |  | topB | −0.33 |
|  | 4fold-bri | 0.47 |  | hcp | −1.04 |
|  | fcc_hcp | 0.47 |  | fcc | −1.04 |
| HCCO | hcp | 0.63 | CH₃CH₂O | fcc | −0.87 |
|  | top | 0.54 |  | hcp | −1.27 |
|  | top_2nd | 0.81 |  | top | −1.02 |
|  | bri_B | 0.18 |  | fcc_nearB | −0.99 |
| HCCHO | top_2nd | −0.01 | CH₃CH₂OH | hcp | −1.71 |
|  | FCC | 0.54 |  |  |  |

Example 10: Cu Oxidation State and Selectivity

As mentioned in FIG. 1(d), the study applied an external electric field to the B-doped Cu system to tune the Cu oxidation states. Here, we applied the same approach proposed by Neugebauer and Scheffler to simulate a uniform electric field, by introducing a dipole layer in the middle of the vacuum to polarize the metal surface. It also mentioned here that the field-dependent adsorption energy of a CO molecule ($E_{ad}(F)$) was calculated by Equation (S3):

$$E_{ad}(F) = -E_{(CO/slab)}(F) + E_{(slab)}(F) + E_{(CO(gas))} \quad (S3)$$

where $E_{(CO/slab)}(F)$ represents the field-dependent total energy for a CO molecule over the Cu slab; $E_{(slab)}(F)$ is the field-dependent energy of the bare slab and $E_{(CO(gas))}$ is the carbon monoxide gas phase energy in the absence of a field.

Figure 3:
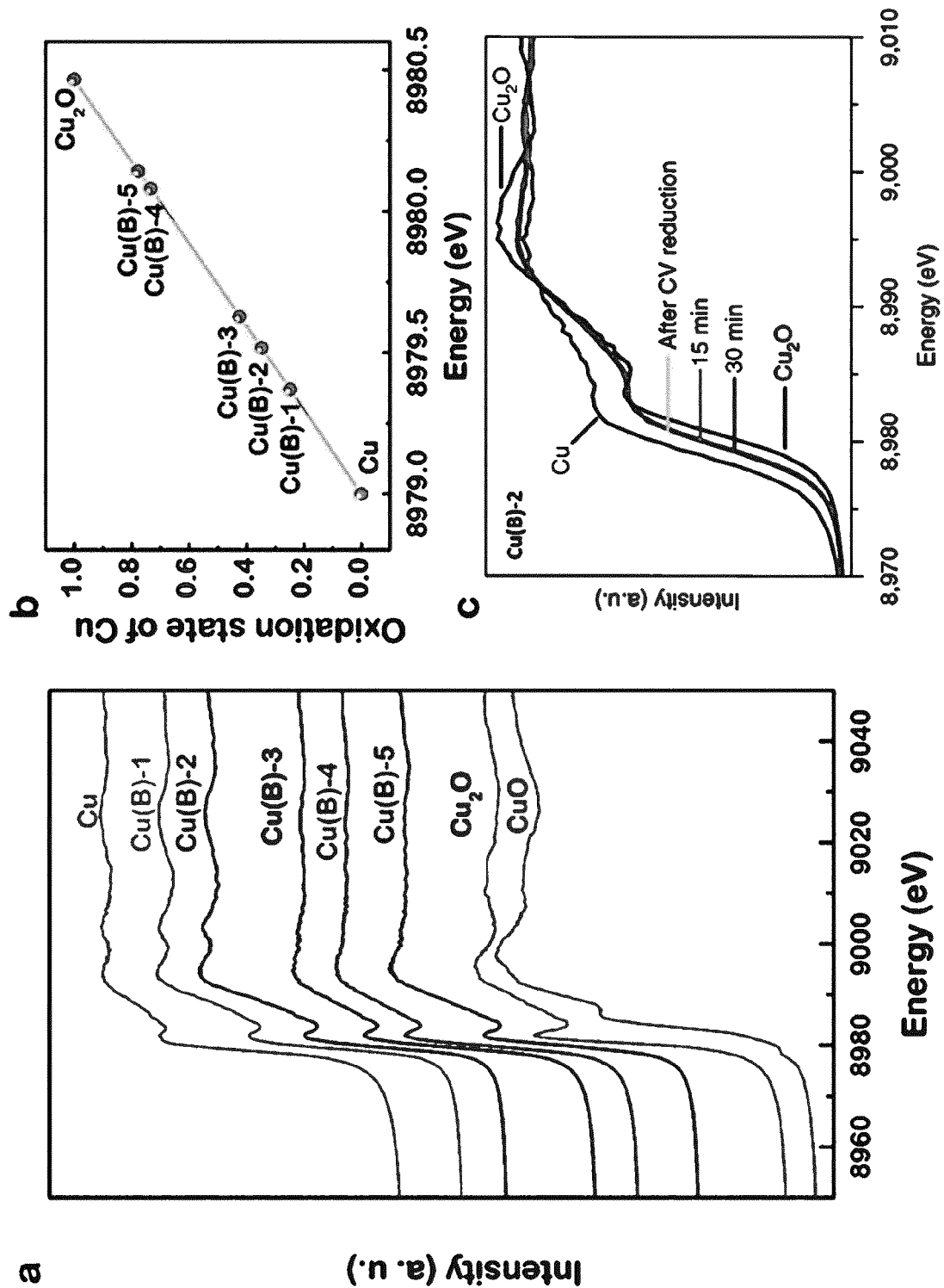
FIG. 3 Oxidation state of Cu in Cu(B) samples. (a) Cu K-edge X-ray absorption near edge spectra of Cu(B) samples after being electrochemically reduced. (b) Average oxidation state of Cu in Cu(B) with different content of B obtained from Cu K-edge XANES. (c) In-situ Cu K-edge X-ray absorption near edge spectra of Cu(B)-2: after CV reduction, 15 min and 30 min; pristine Cu and $Cu_2O$ are listed as references.
Figure 21:
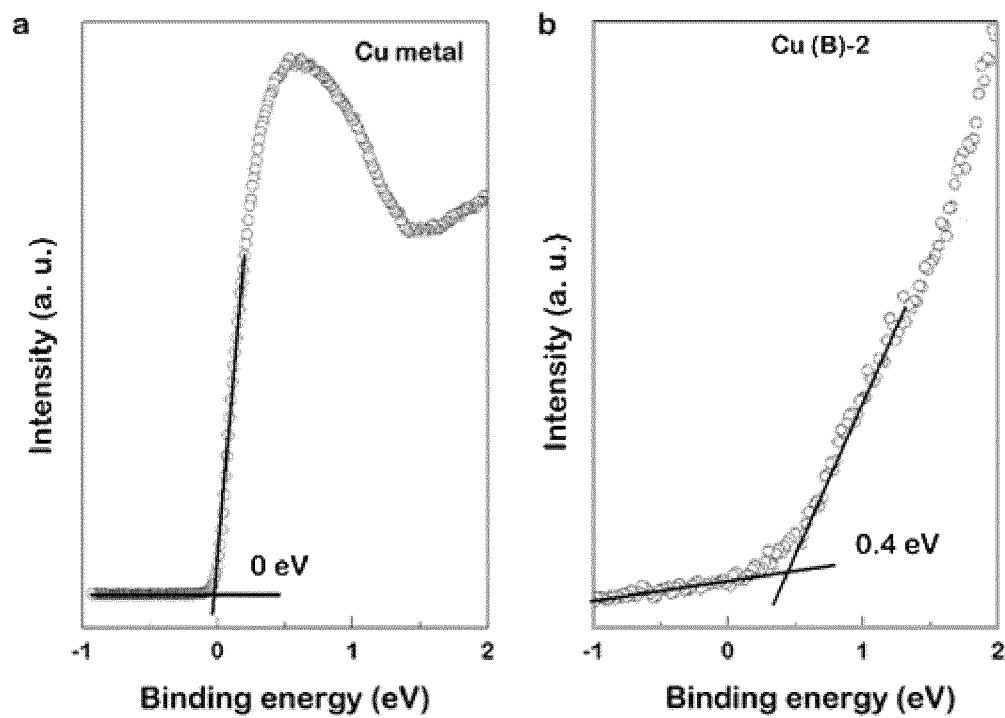
FIG. 21 UPS spectra of Cu and Cu(B)-2. (a) Cu (100) and (b) Cu(B)-2.

The study used ultraviolet photoelectron spectroscopy to investigate the impact of B-doping on the electronic states of Cu. The study found that B-doping produces a shift in the valence band to a deeper level, in agreement with computational simulations (FIG. 21). The study then used X-ray absorption near edge spectroscopy (XANES) to further investigate the impact of B incorporation on Cu oxidation state. To exclude oxygen-containing species, the study electrochemically reduced the Cu(B) samples by applying a highly negative potential (−0.5 V to −2 V versus reversible hydrogen electrode (RHE), 0.1 V/s, 5 cycles). The absorption edges of all the Cu(B) samples reside between those of pristine Cu ($Cu^0$) and $Cu_2O$ ($Cu^{1+}$) (FIG. 3a). To give a direct comparison of the oxidation state of Cu in the Cu(B) samples, the study acquired the Cu oxidation state as a function of Cu K-edge energy shift (FIG. 3b). The average oxidation state of Cu in the Cu(B) samples is found to vary from 0 to +1 as a function of the energy shift (see below table 7). The average oxidation state of Cu increased from 0.25 to 0.78 as the B concentration varied from 1.3% to 2.2%.

TABLE 7

$E_0$ and corresponding oxidation states ($\delta$) of Cu.

| Samples | Pristine Cu | Cu(B)-1 | Cu(B)-2 | Cu(B)-3 | Cu(B)-4 | Cu(B)-5 | $Cu_2O$ |
|---|---|---|---|---|---|---|---|
| $E_0$ | 8979 | 8979.37 | 8979.52 | 8979.63 | 8980.08 | 8980.14 | 8980.48 |
| $\delta$ | 0 | 0.25 | 0.35 | 0.42 | 0.73 | 0.78 | 1 |

Figure 22:
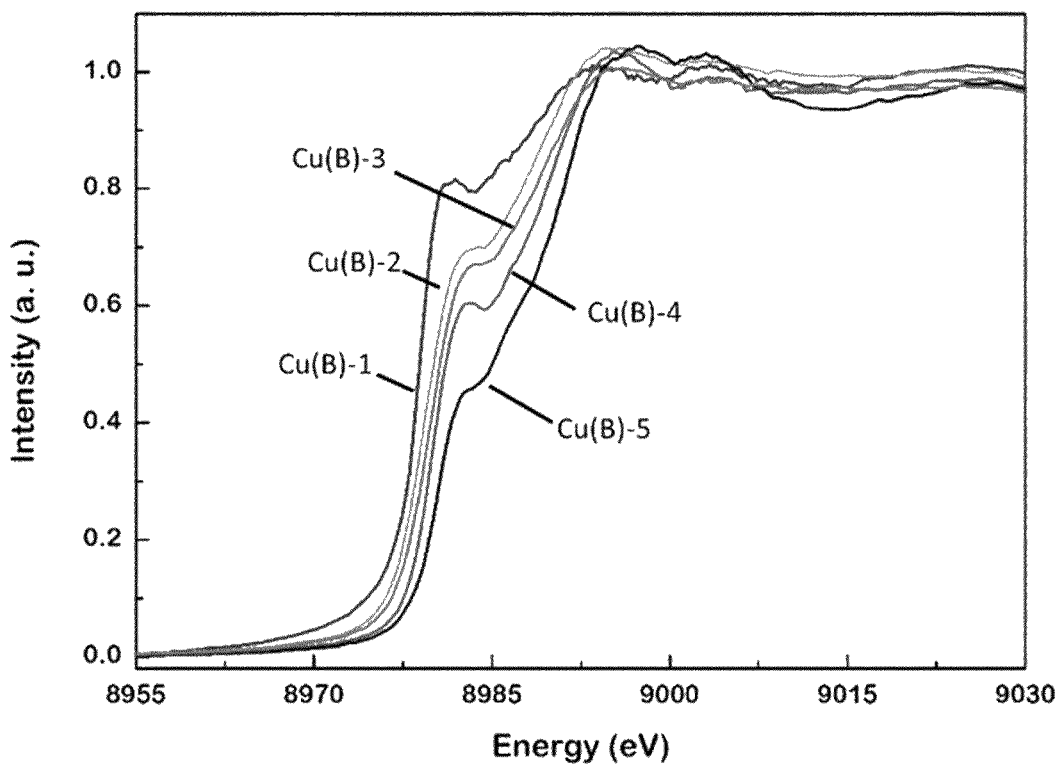
FIG. 22 In-situ Cu K-edge X-ray absorption near edge spectra of Cu(B) samples.

The study investigated the oxidation state of samples under $CO_2RR$ using in-situ XANES. The oxidation state of Cu also increases with B content under $CO_2RR$ (FIG. 22). To compare directly the Cu oxidation state changes during the $CO_2RR$ process, Cu XANES spectra of Cu(B)-2 at different time points (after CV reduction, 15 min and 30 min) relative to the onset of $CO_2RR$ were recorded (FIG. 3c). The study found the average oxidation state of Cu in Cu(B)-2 during the in-situ measurements to be +0.32, similar to the value from ex-situ XANES results of Cu(B)-2 (0.35). These results indicate observation of a stable oxidation state for Cu in the Cu(B) samples over the course of $CO_2RR$.

Figure 4:
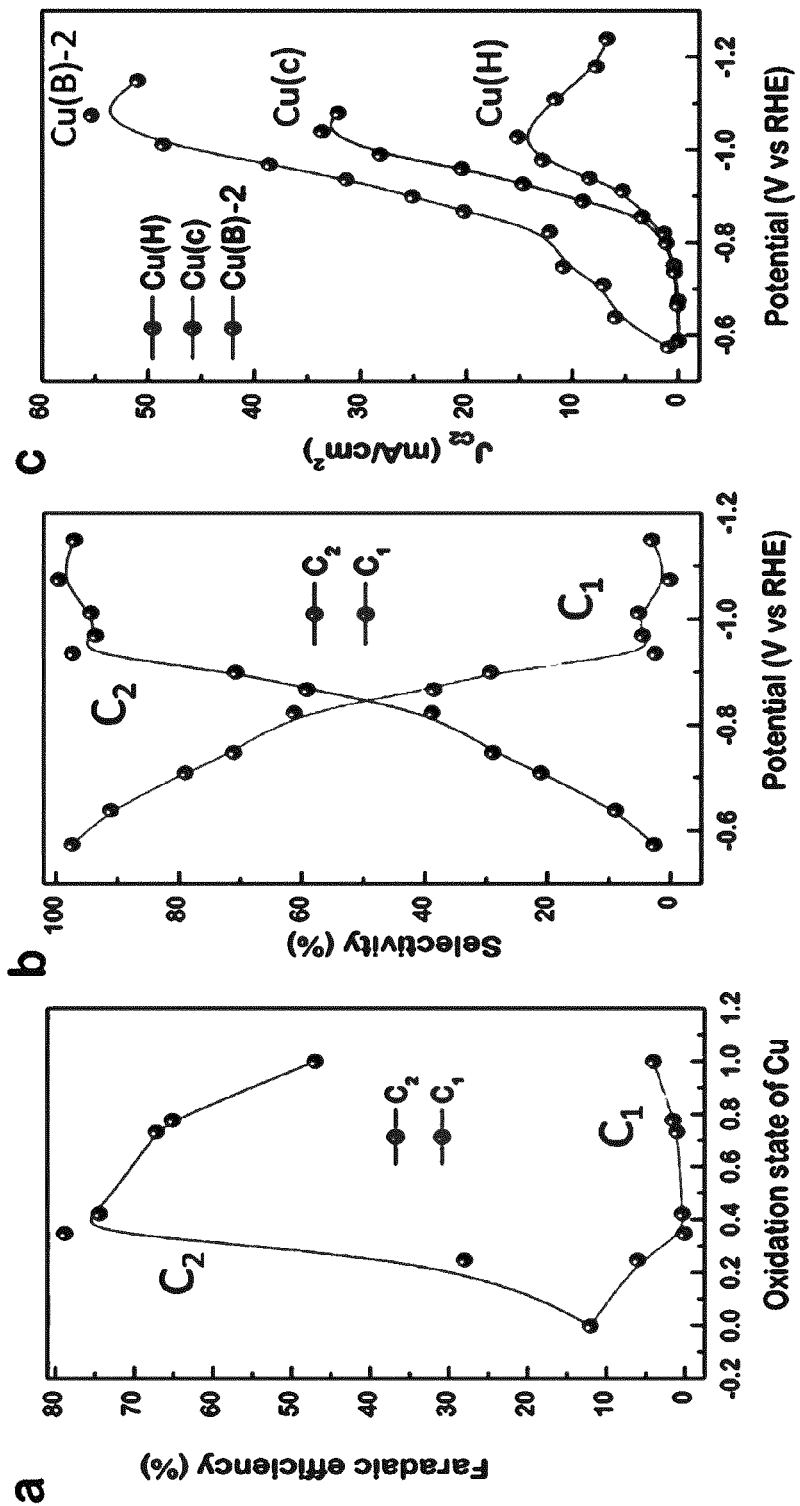
FIG. 4 $CO_2RR$ performance on Cu(B) and control samples. (a) Faradaic efficiency of $C_2$ and $C_1$ at different Cu oxidation state on Cu(B). All the samples were tested using the same potential of −1.1 V verse RHE. (b) Conversion efficiency of reacted $CO_2$ to $C_2$ and $C_1$ products at different potentials on Cu(B)-2. (c) Partial current density of $C_2$ at different potentials on Cu(B)-2, Cu(C) and Cu(H). (d) Faradaic efficiency of ethylene on Cu(B)-2, Cu(C) and Cu(H).
Figure 4:
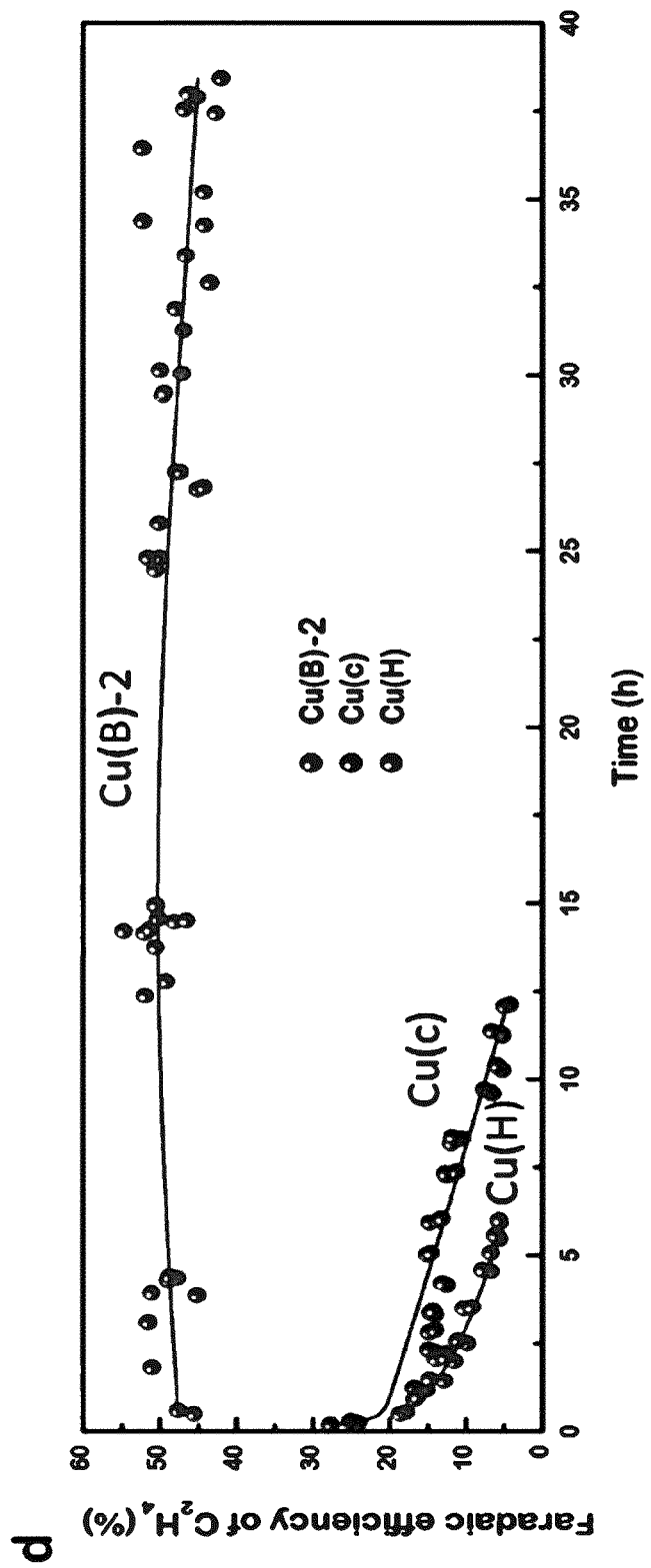
Figure 24:
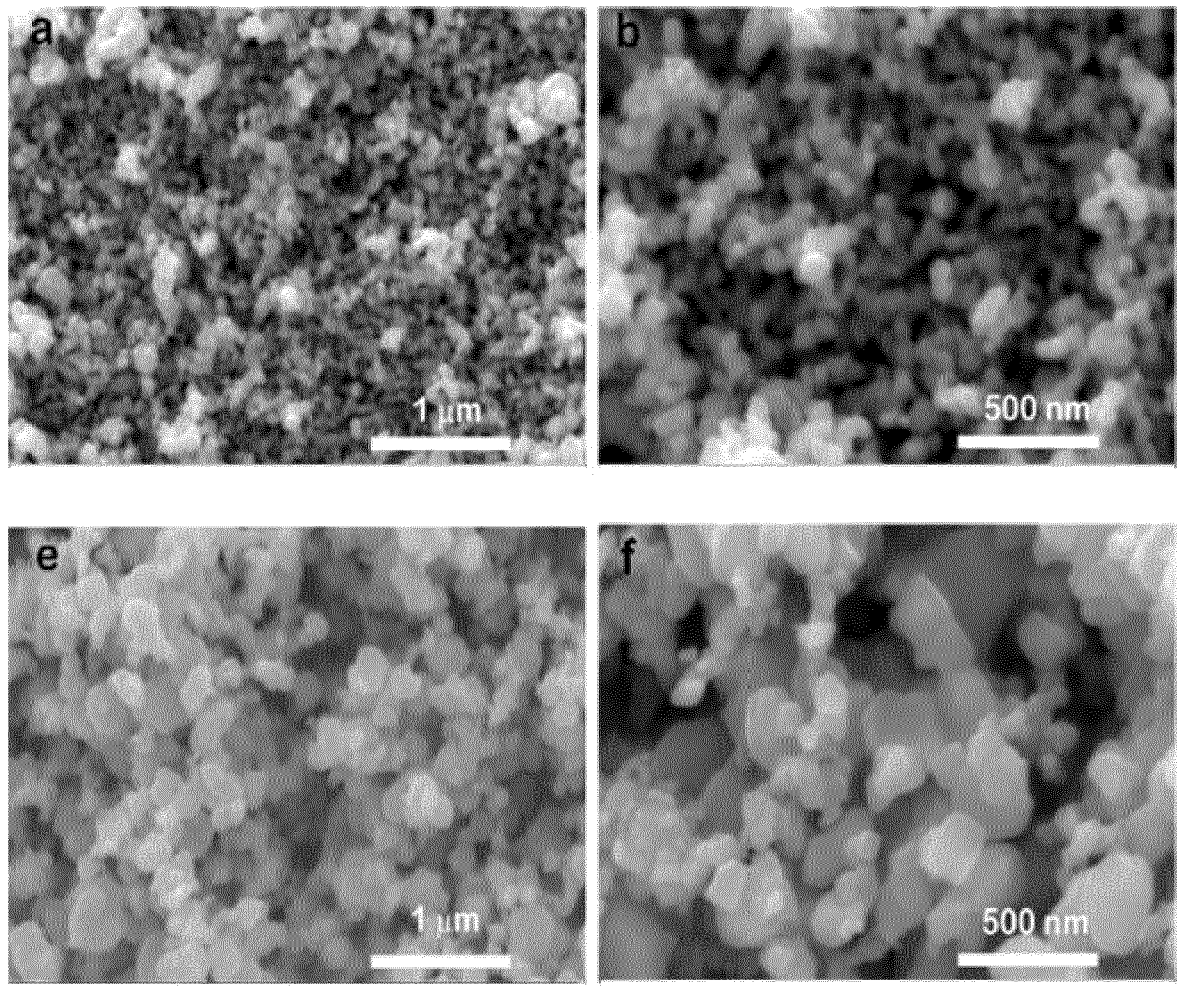
FIG. 24 Morphology and phase information of Cu(H) and Cu(C). (a)-(b) SEM images and corresponding (c) XRD pattern of Cu(H). (e)-(f) SEM images and corresponding (g) XRD pattern of Cu(C).
Figure 24:
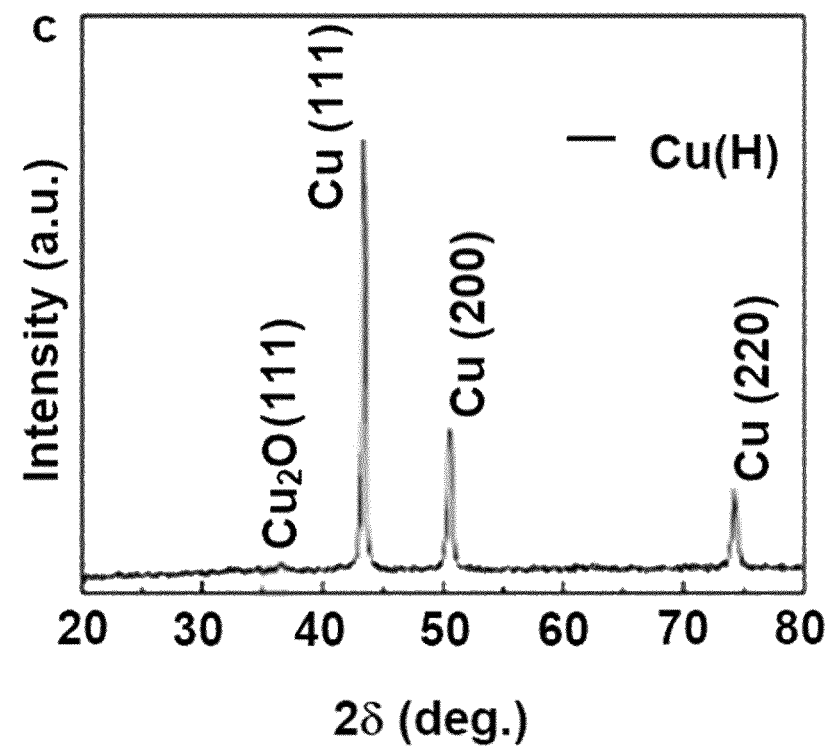
Figure 24:
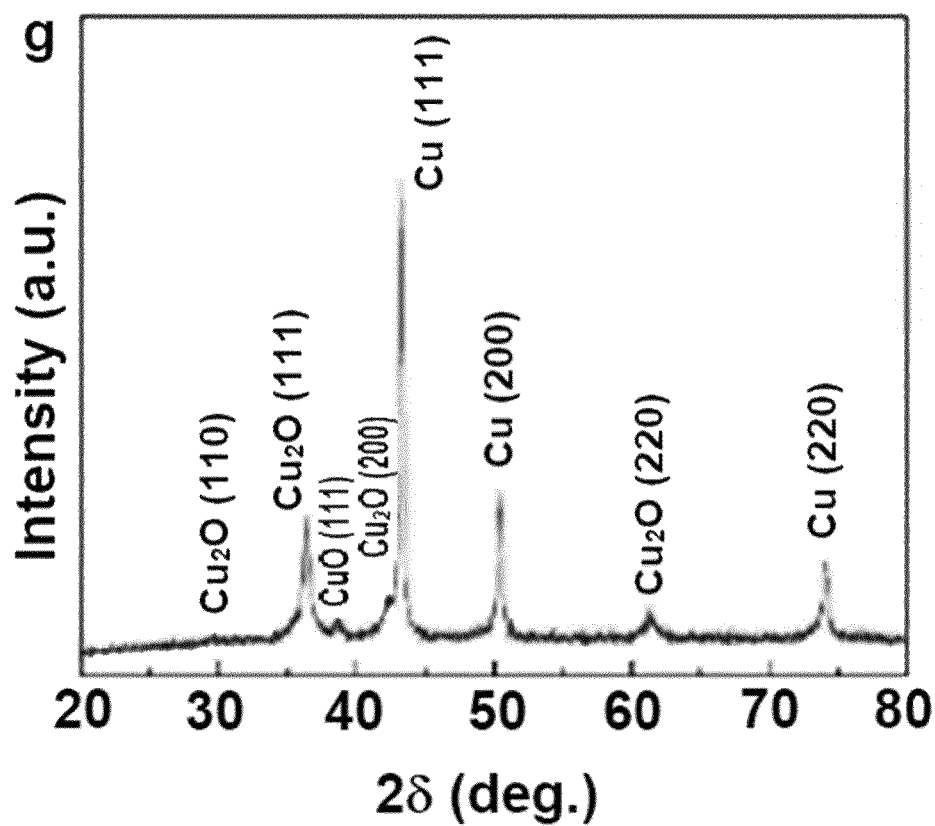

The study then sought to verify whether the Cu oxidation state correlated with total $C_2$ Faradaic efficiency (FIG. 4a). When one plotted experimental $C_2$ Faradaic efficiency versus experimental average Cu oxidation state, one obtained a volcano plot that peaks with an impressive Faradaic efficiency of 79±2% at average Cu valence of +0.35. As control samples, the study also produced pristine Cu (Cu(H)) that was synthesized following a previously-reported procedure based on hydrazine hydrate. The study also produced reference catalysts that consisted of oxidized nano-Cu (Cu(C)) (FIG. 24). The Faradaic efficiencies for $C_2$ were 29±2% for Cu(H) and 37±2% for Cu(C) under their respective optimal potentials for $C_2$ electroproduction. Particularly striking is the extreme selectivity of the B-doped catalyst in favor of $C_2$ over $C_1$: we achieved a maximum selectivity ratio of $C_2$:$C_1$ of 932 (see below table 8).

TABLE 8

Summary of $CO_2RR$ performances on Cu-based electrodes in H-type cell systems.

| Catalyst | $J_{C2}$ (mA/cm$^2$) | F.E. ($C_2H_4$) (%) | F.E. ($C_2H_2OH$) (%) | F.E. of $C_2$ (%) | $^a$ η (%) | $^b$ $C_2/C_1$ | Ref |
|---|---|---|---|---|---|---|---|
| $Cu_2O$ derived Cu | 18 | 35 | 16 | 51 | 81 | 4.4 | Ref. 19 |
| Plasma treated Cu foil | 14 | 60 | 0 | 60 | 90.2 | 4 | Ref. 20 |
| Plasma treated Cu nanocube | 22 | 44 | 22 | 64 | 91.4 | 15 | Ref. 21 |
| Cu nanocubes | 4 | 41 | 4 | 46 | 58 | 2.1 | Ref. 22 |
| $Cu_2O$ derived Cu | 19 | 43 | 16 | 59 | 77.6 | 10 | Ref. 23 |
| Cu foil | 5 | 48 | 22 | 70 | 74.2 | 3.4 | Ref. 24 |
| Cu(I)/C-doped BN | 11.2 | N/A | N/A | 80.3 | 95.6 | 16 | Ref. 25 |
| Cu (H) | 15 | 21 ± 1 | 8 ± 1 | 29 ± 1 | 51.7 | 1.3 | This work |
| Cu(C) | 33 | 33 ± 2 | 14 ± 1 | 47 ± 2 | 72 | 3.3 | This work |
| B-doped Cu | 55 | 52 ± 2 | 27 ± 1 | 79 ± 2 | 99.7 | 932 | This work |

REFERENCES CITED IN THE TABLE

19. Ren D, Deng Y, Handoko A D, Chen C S, Malkhandi S, Yeo B S. Selective Electrochemical Reduction of Carbon Dioxide to Ethylene and Ethanol on Copper(I) Oxide Catalysts. *ACS Catal.* 2015, 5(5): 2814-2821.
20. Mistry H, Varela A S, Bonifacio C S, Zegkinoglou I, Sinev I, Choi Y W, et al. Highly selective plasma-activated copper catalysts for carbon dioxide reduction to ethylene. *Nat. Commun.* 2016, 7: 12123.
21. Gao D, Zegkinoglou I, Divins N J, Scholten F, Sinev I, Grosse P, et al. Plasma-Activated Copper Nanocube Catalysts for Efficient Carbon Dioxide Electroreduction to Hydrocarbons and Alcohols. *ACS Nano* 2017, 11(5): 4825-4831.
22. Loiudice A, Lobaccaro P, Kanali E A C S, T i Huang B H, Ager J W, et al. Tailoring Copper Nanocrystals towards $C_2$ Products in Electrochemical $CO_2$ Reduction. *Angew. Chem.-Int. Ed.* 2016, 55(19): 5789-5792.
23. Handoko A D, Ong C W, Huang Y, Lee Z G, Lin L, Panetti G B, et al. Mechanistic Insights into the Selective Electroreduction of Carbon Dioxide to Ethylene on Cu2O-Derived Copper Catalysts. *The J. Phys. Chem. C* 2016, 120(36): 20058-20067.
24. Murata A, Hori Y. Produ Selectivity Affected by Cationic Species in Electrochemical Reduction of $CO_2$ and CO at a Cu Electrode. *B. Chem. Soc. JPN* 1991, 64(1): 123-127.
25. Sun X, Zhu Q, Kang X, Liu H, Qian Q, Ma J, et al. Design of a Cu(i)/C-doped boron nitride electrocatalyst for efficient conversion of $CO_2$ into acetic acid. *Green Chem.* 2017, 19(9): 2086-2091.

High selectivity of $C_2$ over $C_1$ was further achieved on B doped Cu (111) single crystals (see table 9) and in $K_2HPO_4$ electrolyte (see table 10), indicating generalizable concept that B stabilizes the oxidation state of Cu and drives the electrochemical reduction of $CO_2$ to $C_2$ products.

The improved performance of the B-doped catalyst is accompanied by a reduced onset potential for $C_2$ hydrocarbon electroproduction: −0.57 V (versus RHE) (FIGS. 4c and 23) for the best samples, fully 0.1 V and 0.18 V lower than those of Cu (c) and Cu(H), respectively.

Figure 23:
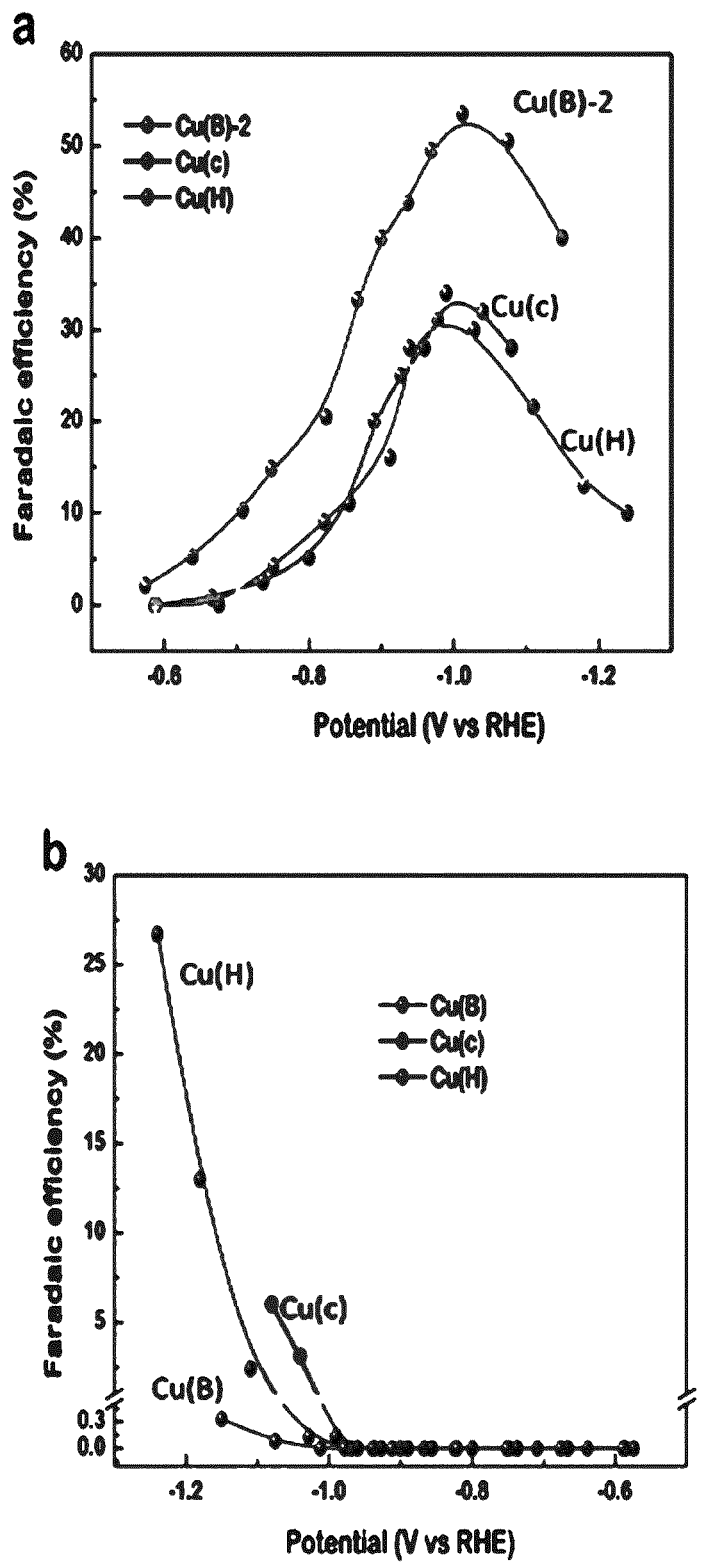
FIG. 23 Onset potentials of ethylene and methane on Cu(B)-2 and control samples.

The presence of $Cu^{\delta+}$ sites on the Cu surface is also thought to increase the energy requirements for direct reduction of $CO_2$ to methane. For the Cu(B)-2 sample, the onset potential of methane is determined to be −1.1 V (versus RHE), which is 0.1 V higher than those of Cu(C) and Cu(H) (−1.0 V versus RHE). Interestingly, less than 0.5% of methane was detected during potentials ranging from −0.6 V to −1.2 V (versus RHE). Moreover, only a slight increase of methane Faradaic efficiency (0.3%) was observed when the study increased the potential by 0.1 V over and above the onset potential of methane. In contrast, the corresponding methane Faradaic efficiency increase was found to be ~2.0% for Cu (c) and Cu(H) samples (FIG. 23).

In sum, the direct reduction of $CO_2$ to methane is almost completely suppressed on the Cu(B)-2 sample. The onset potential of $CO_2RR$ to $C_2$ hydrocarbons decreases to −0.57 V versus RHE while that of methane is substantially higher at −1.1 V versus RHE, showing a more favorable potential window for ethylene production.

Figure 25:
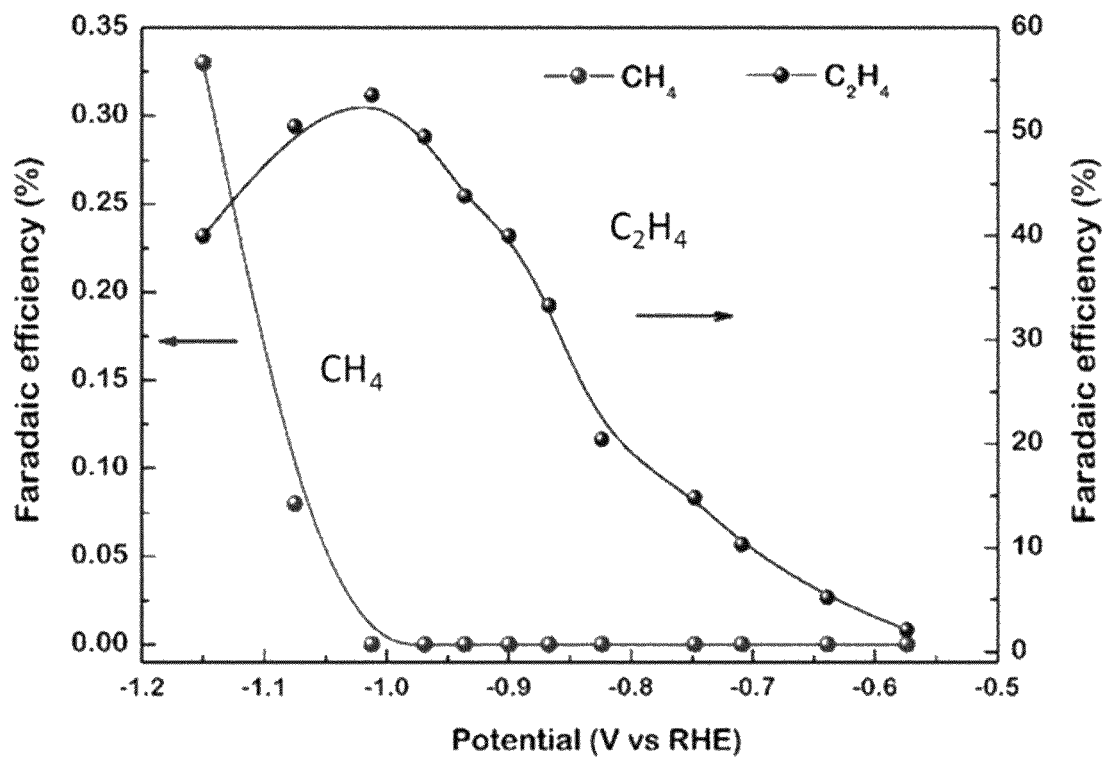
FIG. 25 Faradaic efficiency of methane and ethylene at different potentials on Cu(B)-2.

The conversion efficiency of $CO_2$ to $C_2$ products increases dramatically as the applied voltage is rendered even more negative, towards −0.9 V versus RHE (FIG. 4b). The high $C_2$ selectivity is maintained over a wide potential window that spans −0.9 V to −1.2 V versus RHE. The maximum Faradaic efficiency to ethylene (53±1%) is achieved at −1.0 V versus RHE, which is 0.1 V lower than the onset potential for methane, accounting for the excellent selectivity of ethylene over methane in gas products (FIG. 25).

Figure 26:
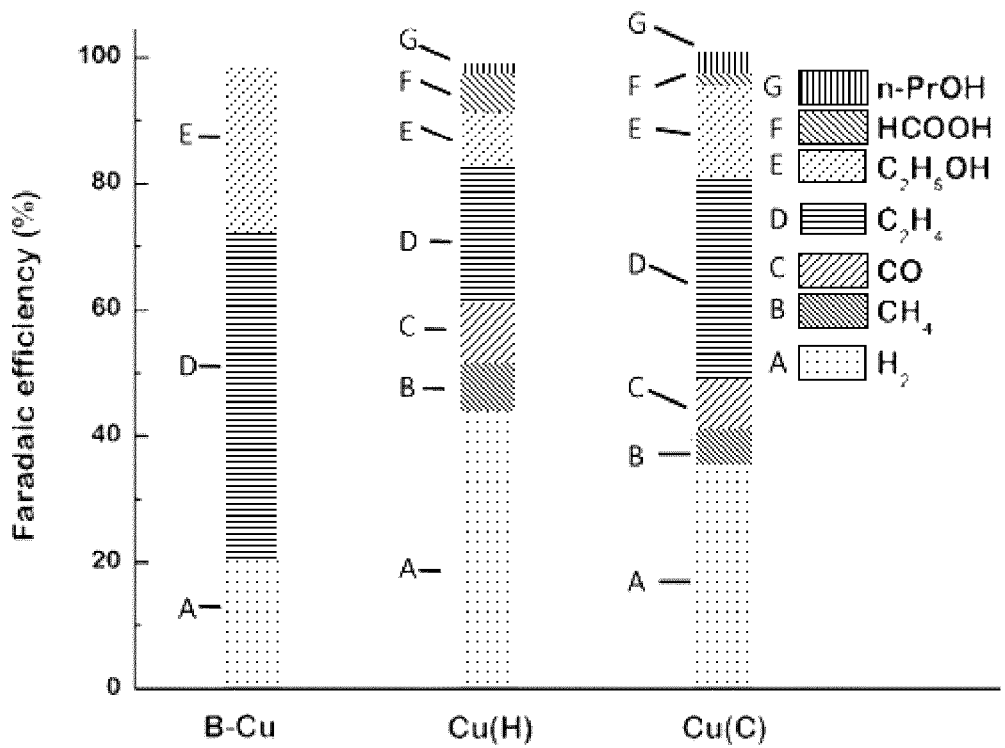
FIG. 26 Product distributions from $CO_2RR$ on Cu(B)-2 and control samples; Faradaic efficiencies for each product on Cu(B)-2 and control samples.
Figure 27:
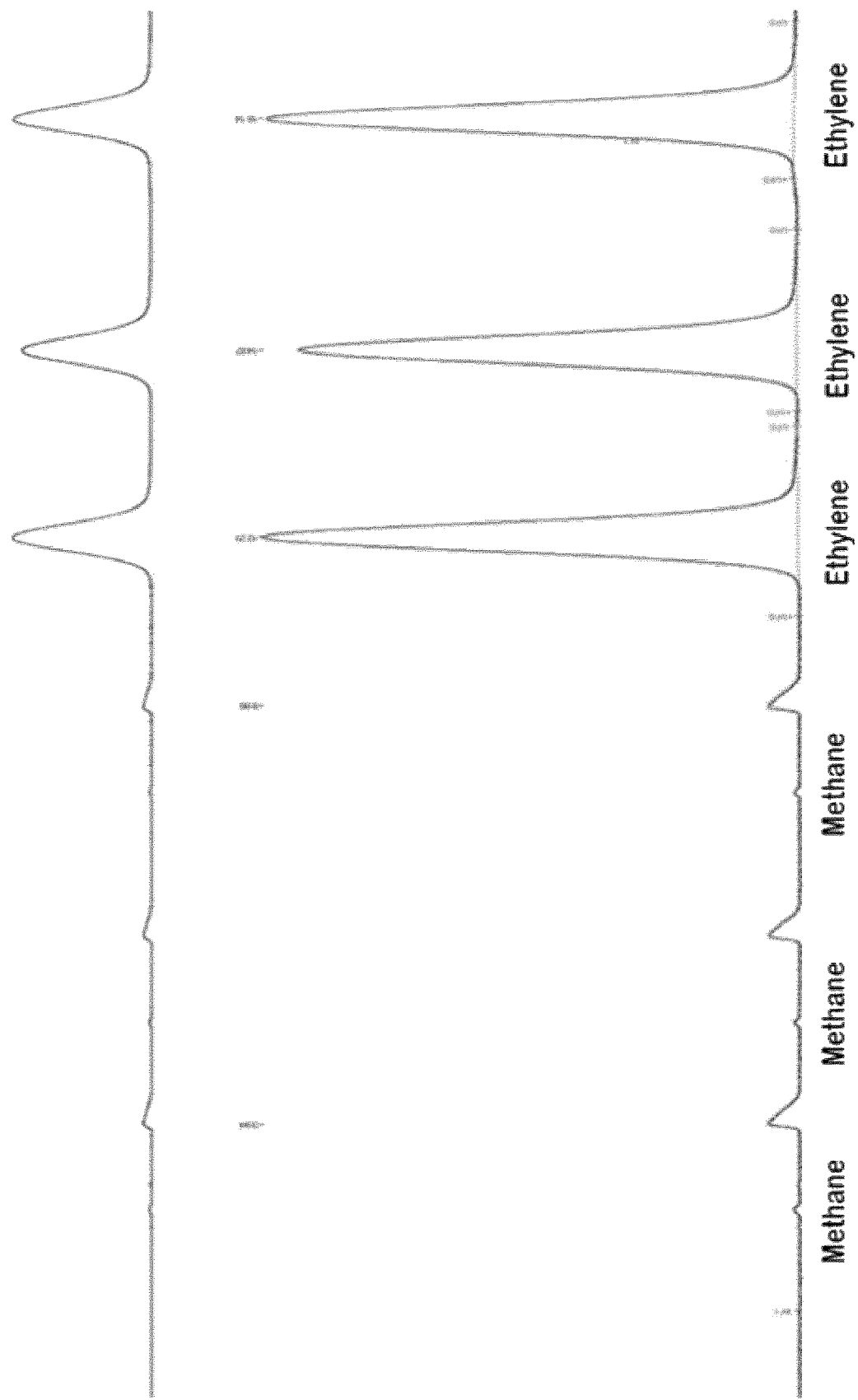
FIG. 27 Representative GC traces of gaseous products from FID channel.
Figure 28:
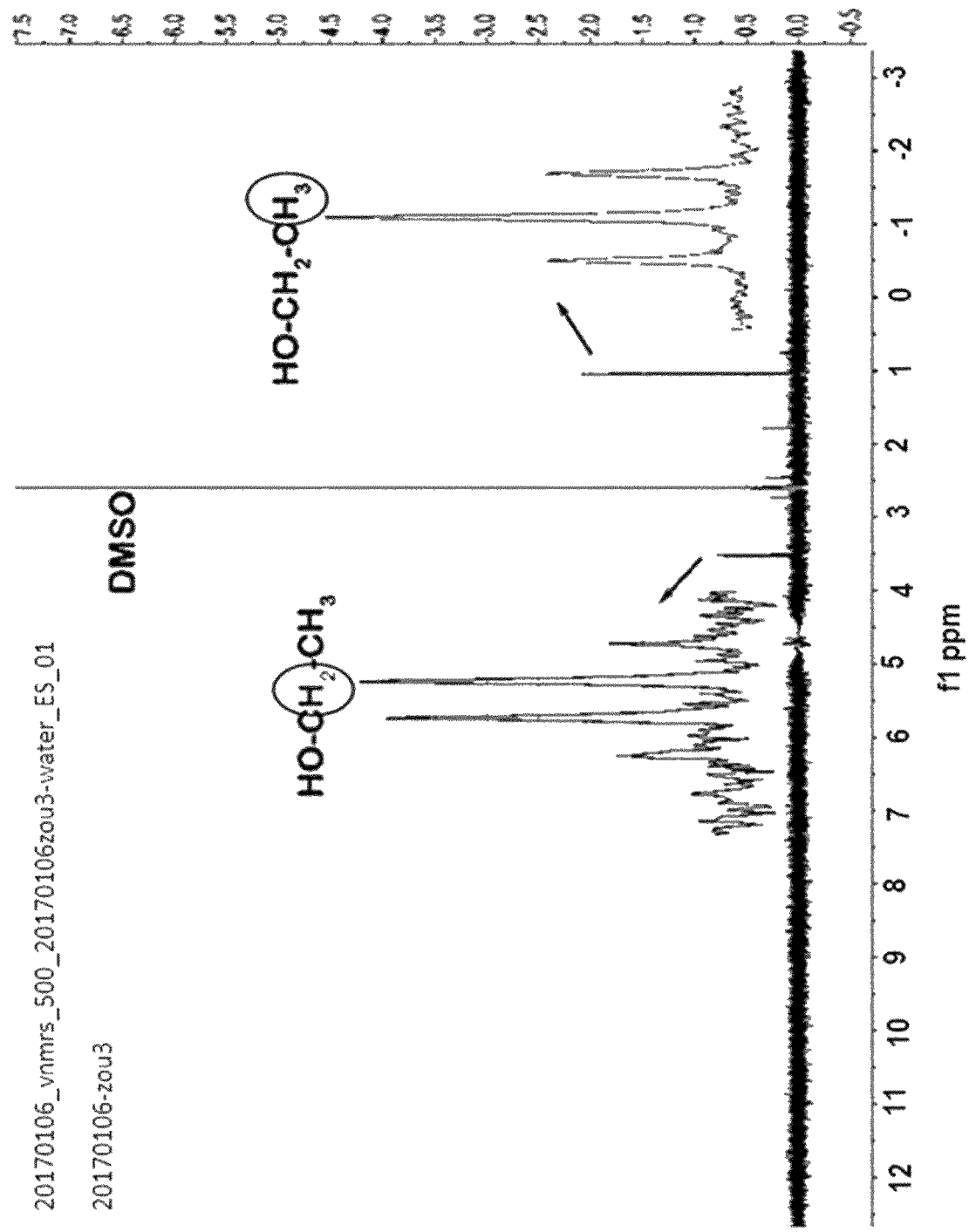
FIG. 28 Proton NMR spectrum of the electrolyte after electrochemical $CO_2RR$ process on the Cu(B)-2 sample.

Narrowing the product distribution is desired in the electrochemical $CO_2RR$ process. The product distributions for the Cu(B)-2 versus the control samples were further investigated (FIG. 26). Ethylene and ethanol are the major hydrocarbons from $CO_2RR$ on Cu(B)-2, with a maximum Faradaic efficiency for $C_2$ products of 79±2% and less than 0.1% of $C_1$ product (FIGS. 5, 27 and 28) at −1.1 V versus RHE. Similar promoting effects that have the effect of narrowing the product distribution were also observed on other samples with different B-doping concentrations (see table 11).

TABLE 9

Comparisons of the selectivity of $C_2$ over $C_1$ on a single crystal Cu (111) surface that has been doped with B versus the pristine one.

| Sample | $FE_{C2}$ (%) | $FE_{C1}$ (%) | $C_2/C_1$ (/100) |
|---|---|---|---|
| Cu (111) | 3.0 | 32.8 | 9.1 |
| B-doped Cu (111) | 10.5 | 11.7 | 89.7 |

TABLE 10

Summary of the CO2RR performance using 0.1 M K2HPO4 as electrolyte with applied potential of −2.23 V vs Ag/AgCl.

| Sample | Current density (mA/cm$^2$) | Faradaic efficiency (%) | | | | |
|---|---|---|---|---|---|---|
| | | $H_2$ | $CH_4$ | $C_2H_4$ | HCOOH | $C_2H_5OH$ | $C_3H_7OH$ |
| Cu(B)-2 | 100 | 27.8 | 0.6 | 47.4 | 1.5 | 18.2 | 1.2 |
| Cu(H) | 57.8 | 47.3 | 32.6 | 9.2 | 0 | 0 | 0 |
| Cu(C) | 74.7 | 66.4 | 29.0 | 0.4 | 0 | 0 | 0 |

TABLE 11

Product distributions over Cu(B) samples.

| Sample | $^a$ Faradaic efficiency (%) | | | | | | |
|---|---|---|---|---|---|---|---|
| | $H_2$ | CO | $CH_4$ | $C_2H_4$ | HCOOH | $C_2H_5OH$ | $C_3H_7OH$ |
| Cu(B)-1 | 55.1 | 0 | 9.3 | 26.5 | 0.3 | 6.9 | 0 |
| Cu(B)-2 | 19.5 | 0 | 0.08 | 52.5 | 0 | 27.6 | 0 |

TABLE 11-continued

Product distributions over Cu(B) samples.

| | $^a$ Faradaic efficiency (%) | | | | | |
|---|---|---|---|---|---|---|
| Sample | $H_2$ | CO | $CH_4$ | $C_2H_4$ | HCOOH | $C_2H_5OH$ | $C_3H_7OH$ |
| Cu(B)-3 | 26.2 | 0 | 0.17 | 50.9 | 0 | 23.9 | 0 |
| Cu(B)-4 | 25.8 | 0 | 1.2 | 48.2 | 0 | 19.6 | 0 |
| Cu(B)-5 | 27.9 | 0 | 3.5 | 47.6 | 0 | 17.5 | 0 |

In contrast, in the case of the control samples, the study obtained $C_1$ products with Faradaic efficiency of 24±1% (Cu(H)) and 16% (Cu(C)) at their optimized applied potentials for the formation of $C_2$ products (see below table 12).

TABLE 12

Summary of the current density and product distributions over Cu(B)-2 and control samples using 0.1M KCl as electrolyte under their respective optimal potentials.

| | $^a$ J | $^a$ Faradaic efficiency (%) | | | | | | |
|---|---|---|---|---|---|---|---|---|
| Sample | (mA/cm$^2$) | $H_2$ | CO | $CH_4$ | $C_2H_4$ | HCOOH | $C_2H_5OH$ | $C_3H_7OH$ |
| Cu(B)-2 | 70 | 20 ± 2 | 0 | 0.08 | 52 ± 2 | 0 | 27 ± 1 | 0 |
| Cu(H) | 51 | 44 ± 2 | 10 ± 1 | 8 ± 1 | 22 ± 1 | 6 ± 1 | 8 ± 1 | 2 ± 0.5 |
| Cu(C) | 70 | 66.4 | 8 ± 1 | 6 ± 1 | 33 ± 2 | 2 ± 0.5 | 14 ± 1 | 4 ± 0.5 |

Figure 29:
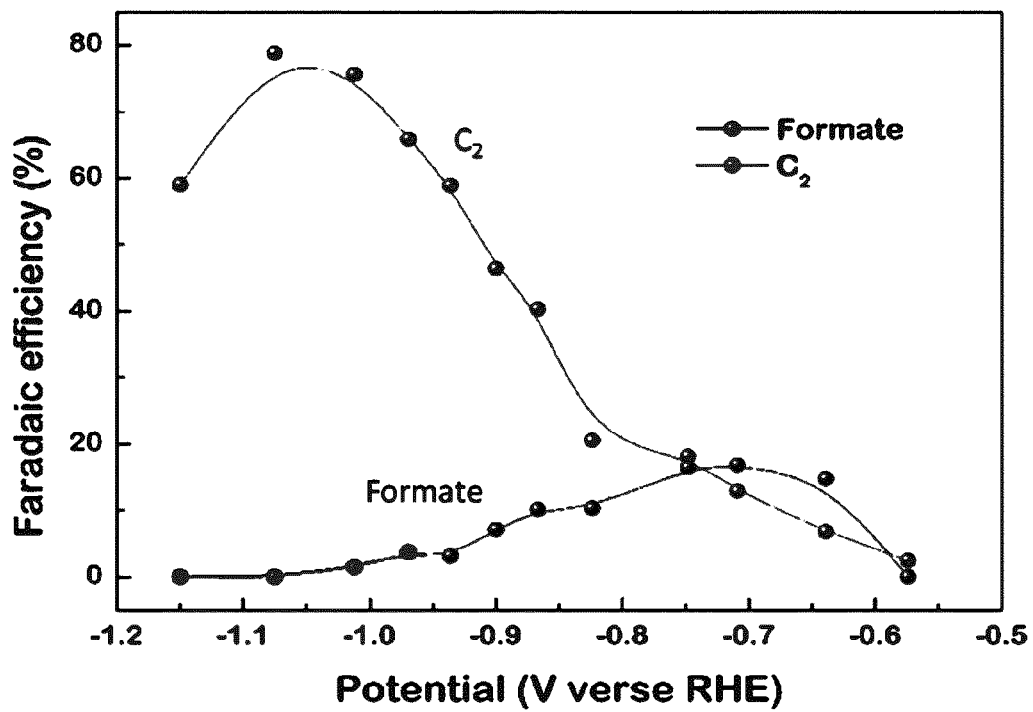
FIG. 29 Faradaic efficiency of Formate and $C_2$ over Cu(B)-2 at different applied potentials.

The ratios were for Cu(H):$C_2/C_1$=1.2 and for Cu(C):$C_2/C_1$=2.3. Formic acid and $C_3$ products were not detected on the Cu(B)-2 sample (FIG. 29). Thus, the Cu(B) sample selectively generates $C_2$ products with a narrow product distribution.

Partial current density reports the activity of an electrocatalyst. A partial current density $J_{C2}$ of 10 mA/cm$^2$ is achieved for the case of the Cu(B)-2 sample when the applied potential is −0.74 V. This is much lower than the potentials to reach this same current for the cases of Cu(C) (−0.90 V versus RHE) and Cu(H) (−0.95 versus RHE).

Figure 30:
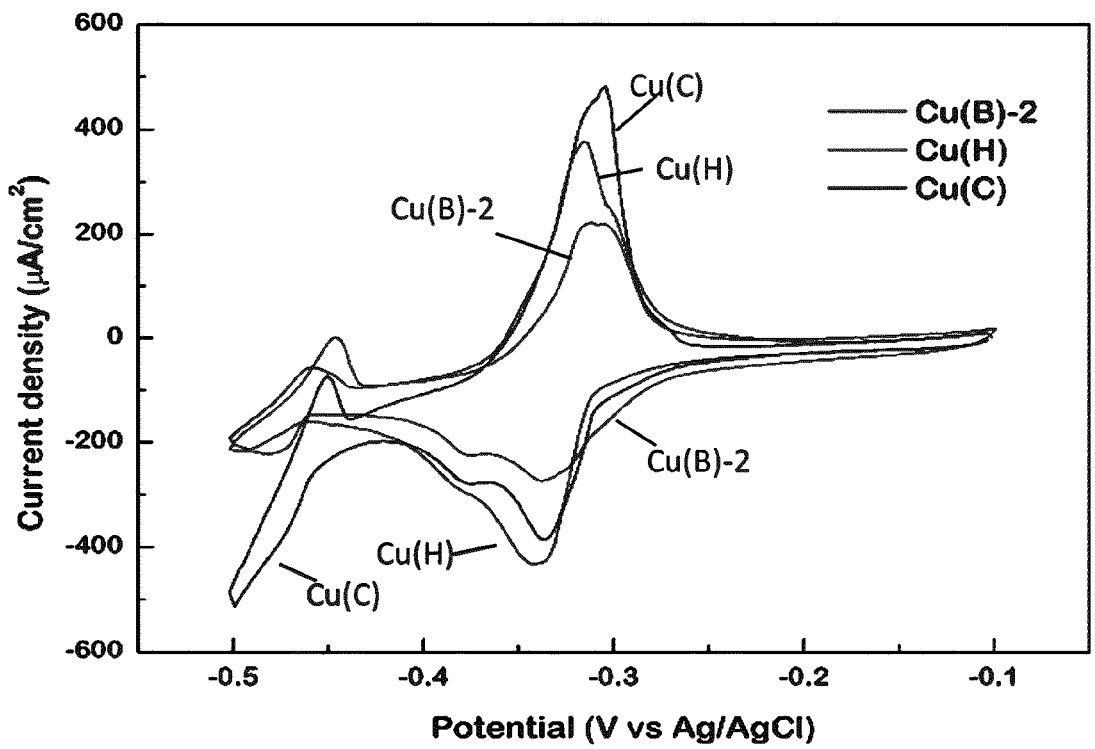
FIG. 30 ECSA of Cu(B) and control samples. CV curves of Pb UPD of Cu(B)-2 and control samples.
Figure 32:
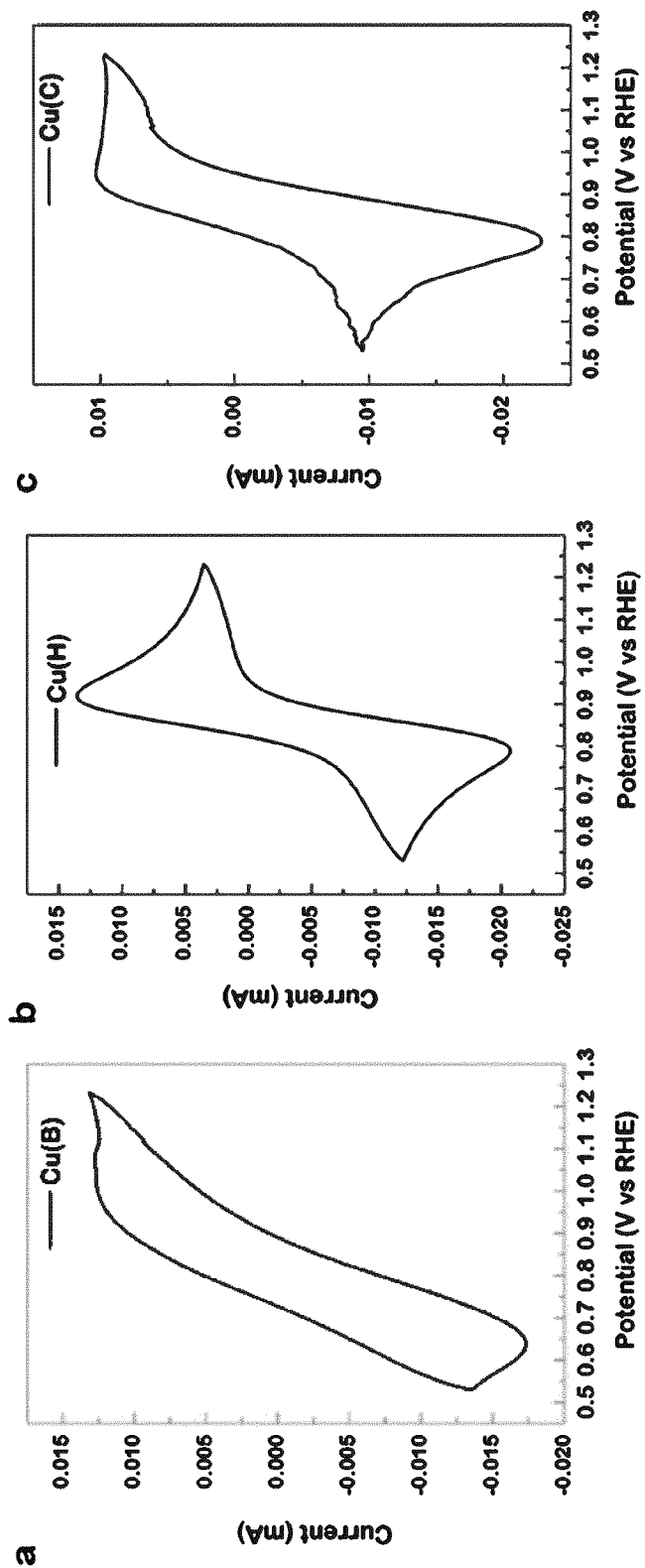
FIG. 32 Cyclic voltammetry curves of Cu(B)-2 and control samples in 5 mM $K_3Fe(CN)_6$/0.1 M KCl solution with scan rate of 5 $mVs^{-1}$.

The study obtained a maximum $J_{C2}$ (55 mA/cm$^2$) when using the Cu(B)-2 sample at −1.1 V versus RHE. This is 3.7 and 1.7 times higher than the maximum $J_{C2}$ for Cu(H) and Cu(C), respectively. The study also reports the current density normalized to the electrochemically active surface area (ECSA) (FIGS. 30 and 32 and Table 13). Once current is renormalized to the ECSA, the peak $J_{C2}$ value is 3.0 and 1.9 times higher than those of the Cu(H) and Cu(C) cases.

TABLE 13

ECSA of Cu(B)-2 and control samples.

| Samples | $^a$ ECSA-1 (cm$^2$) | $^b$ ECSA-2 (cm$^2$) |
|---|---|---|
| Cu(B)-2 | 0.628 | 0.075 |
| Cu(H) | 0.841 | 0.091 |
| Cu(C) | 0.807 | 0.087 |

Example 11: Stability

Figure 31:
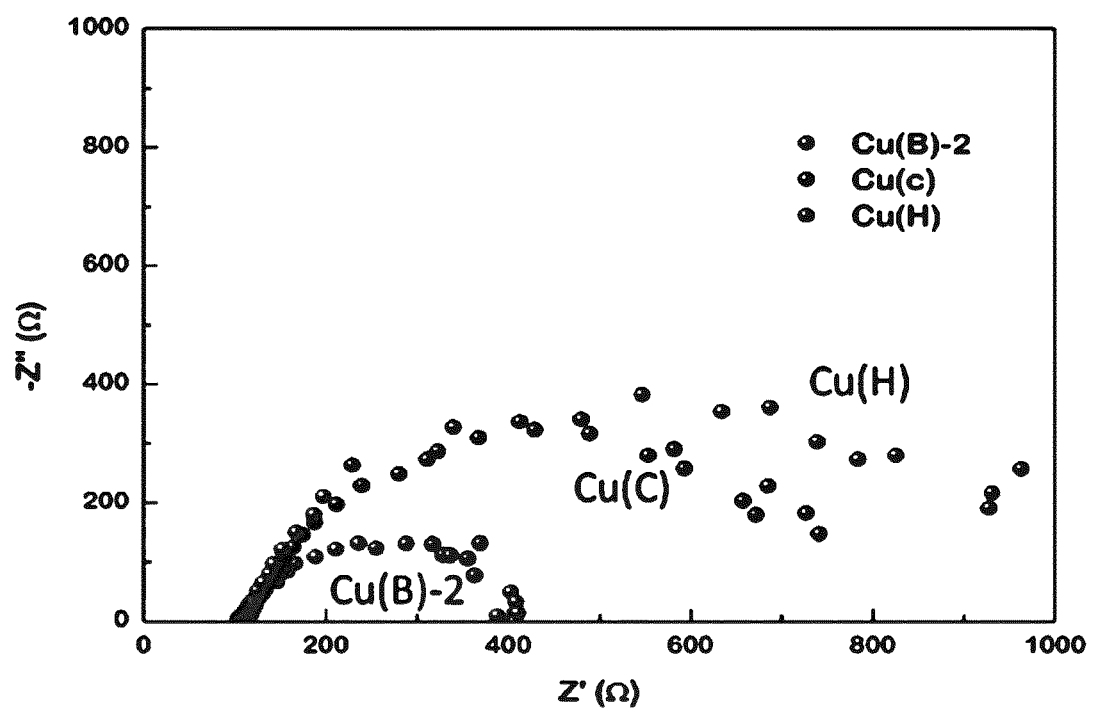
FIG. 31 Nyquist plots of Cu(B)-2 and control samples.
Figure 33:
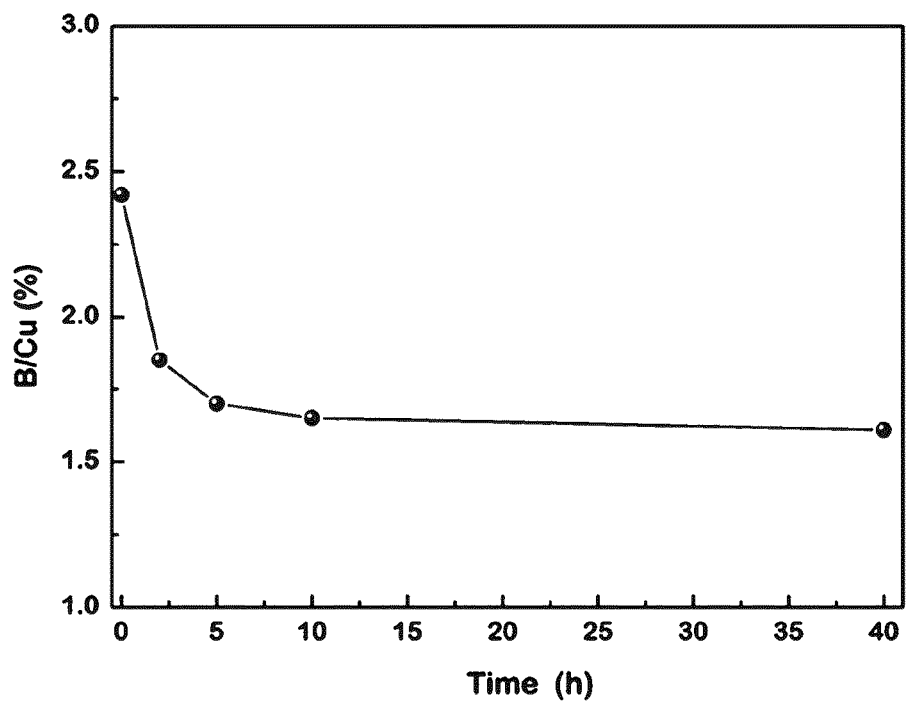
FIG. 33 Stability of B in Cu(B) sample. B concentrations in Cu at different $CO_2RR$ reaction times determined by ICP-OES. The B concentration tends to be stable after 5 h $CO_2RR$ process.

The study investigated charge transfer processes at electrode/electrolyte interface using electrochemical impedance spectroscopy (EIS). Compared to Cu(H) and Cu(C), the diameter of the Nyquist circle for Cu(B)-2 is the smallest, indicating an acceleration in the charge transfer process between Cu(B)-2 and electrolyte (FIG. 31). The improved charge transfer process reveals the low activation energy for the reactions on Cu(B)-2, which is further confirmed by linear sweep voltammetry (LSV) and related Arrhenius plots (FIG. 33). These results confirm the stability of the $Cu^{\delta+}$ sites and corroborate the $Cu^0$ and $Cu^{\delta+}$ favourability of the Cu(B) surface for the electrochemical production of $C_2$ hydrocarbons.

Long-term stability remains a challenge for Cu or modified Cu despite their effectiveness in the electroreduction of $CO_2$ to multi-carbon hydrocarbons. The study found that pristine Cu (Cu(H)) show modest stability for $CO_2$RR to ethylene following 6 hours of operation. Cu(C) shows slightly higher durability over this same time period (FIG. 4d).

Figure 34:
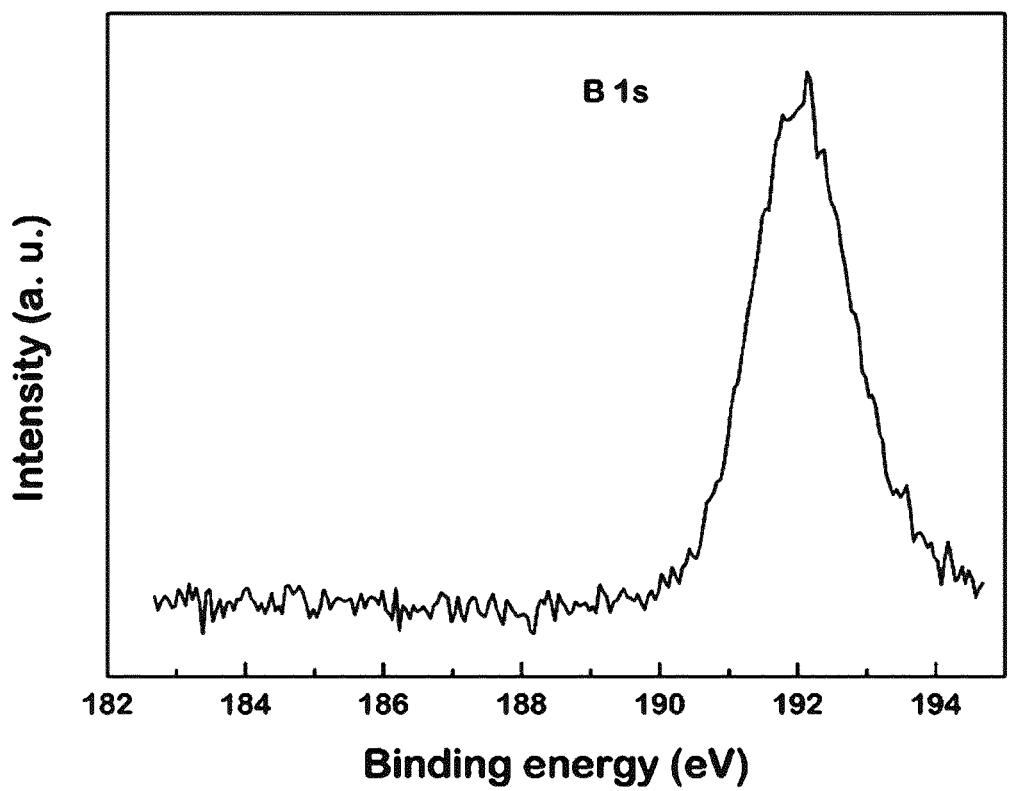
FIG. 34 XPS spectra of B 1s spectra of B-doped Cu (111) surface.

The B-doped Cu showed superior stability, achieving 40 hours of continuous operation at −1.1 V versus RHE without loss of performance. This indicates that B is stable as a dopant in Cu (FIG. 34, 36). The $Cu^{\delta+}$ sites induced by B-doping are stable at high applied potential during the $CO_2$RR process (FIG. 3c), enabling its relative stability in performance.

Example 12: Preparation of Catalyst Samples

Cu(B) samples were prepared through a facile one-step process using copper(II) chloride ($CuCl_2$) and sodium borohydride ($NaBH_4$) as precursors. Since B solubility in copper is low, $CuCl_2$ was added into highly concentrated sodium borohydride solution instantly in order to alloy the B with Cu as much as possible. Firstly, $CuCl_2$ and $NaBH_4$ were freshly prepared using freshly frozen water (around 0° C.). Briefly, 2 mL $CuCl_2$ solution with a certain concentration was injected rapidly into the $NaBH_4$ (5 M, 2 mL) solution until no bubbles formed. The precipitates obtained were subsequently washed three times with 150 mL of water (50 mL each time) and 50 mL of acetone one time to completely remove the unreacted precursors and other possible by-products. Then the powder was immediately dried under vacuum overnight. Different amounts of $CuCl_2$, namely 400 mg for Cu(B)-1, 300 mg for Cu(B)-2, 200 mg for Cu(B)-3, 100 mg for Cu(B)-4, 25 mg for Cu(B)-5, were used. Control sample Cu(H) was synthesized following a similar procedure but using the equal amount of hydrazine hydrate instead of $NaBH_4$ as a reducing reagent. 25 nm nano-Cu (Sigma) which was partially oxidized was also used as a control sample in this work.

Figure 35:
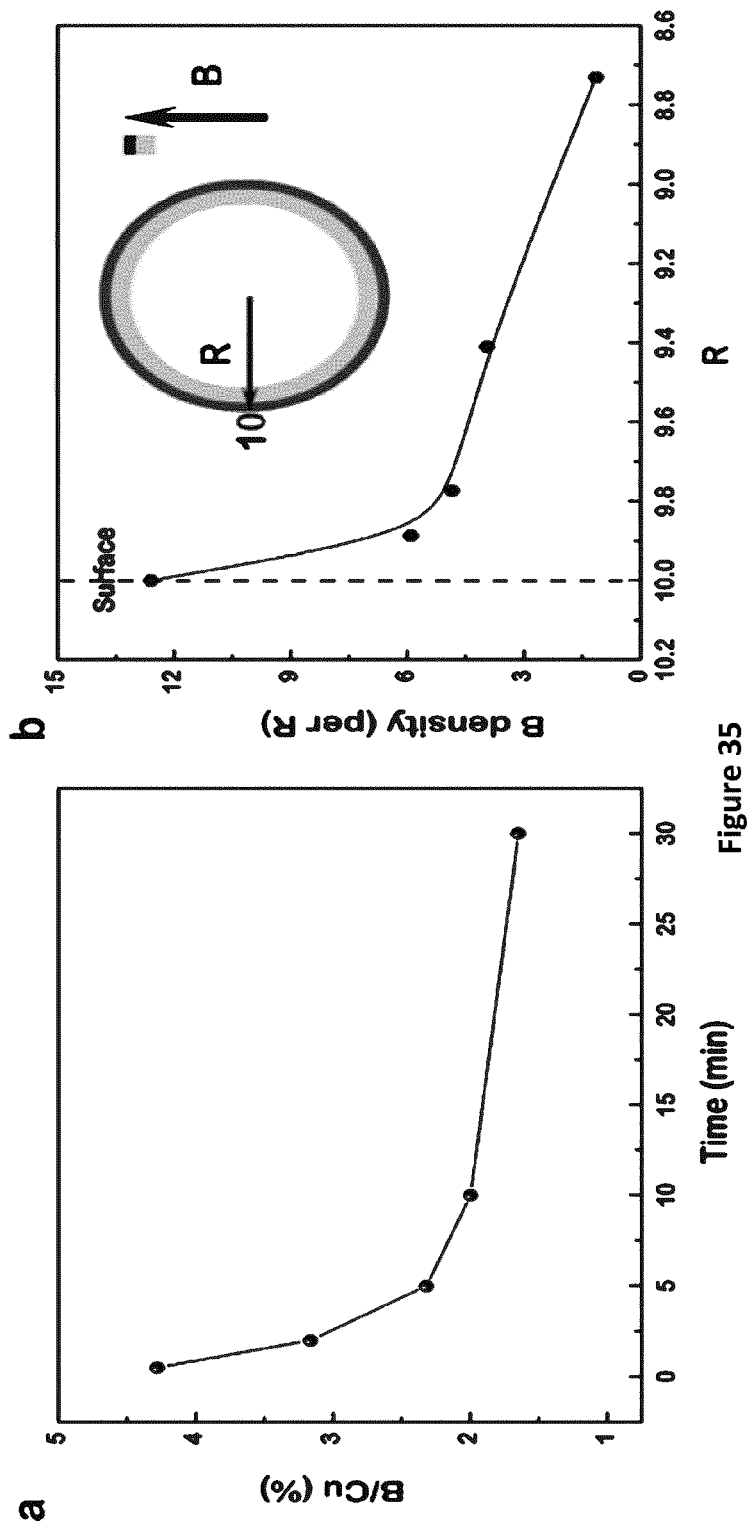
FIG. 35 Dissolving time-dependent B concentrations of Cu(B) samples after $CO_2RR$ for 5 h measured by ICP-OES. (a) B concentrations of Cu(B) after $CO_2RR$ for 5 h and its (b) corresponding distribution model.
Figure 36:
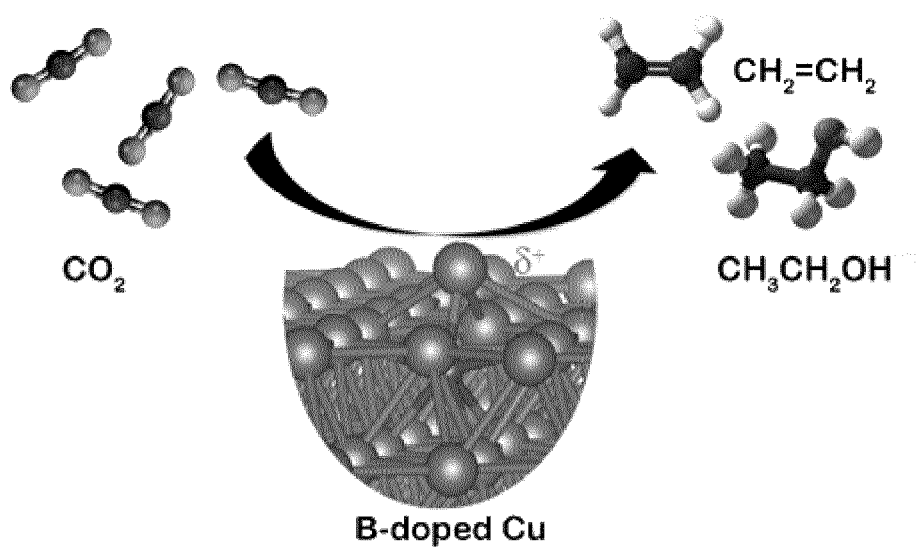
FIG. 36: schematic catalysis representation

B-doped Cu (111) surface sample was synthesized by incipient wetness impregnation of single crystal Cu (111) foil with boric acid aqueous solutions. After impregnation, the Cu foil was dried and then calcined at 500° C. in $H_2$/Ar gas (5 vol % $H_2$) for 6 h. Presence of B was confirmed by XPS test (FIG. 35).

Example 13: Preparation of Cathode Electrodes

Typically, the catalyst ink was prepared by ultrasonic dispersion of 10 mg of the sample powder with 20 μl Nafion solution (5%) in 1 mL methanol for 30 min. Subsequently, 5 μL of the as-prepared ink was drop coated on the glass carbon electrode with a surface area of 0.07 cm². The electrode was then slowly dried under methanol atmosphere for the subsequent electrochemical testing experiments.

Example 14: Catalytic Evaluation

All $CO_2$ reduction experiments were performed in a gas-tight two-compartment H-cell separated by an ion exchange membrane (Nafion117). The anode side and cathode side were filled with 55 mL of 0.1 M $KHCO_3$ and 0.1 M KCl, respectively. The reaction was performed at constant iR-corrected potential. Firstly, the cathode side was electrochemically reduced by CV method ranged from −0.5 V to −2.0 V (versus RHE) at a rate of 0.1 V/s for 5 cycles to completely reduce the possible oxidized species. The gas products from $CO_2$ reduction were analyzed using the gas chromatograph (PerkinElmer Clarus 600) equipped with thermal conductivity (TCD) and flame ionization detectors (FID) detectors. The liquid samples were collected and analyzed by NMR instruments by taking (Agilent DD2 500) DMSO as a reference. The potential (versus Ag/AgCl) was converted to RHE using the following equations:

$E_{RHE} = E_{AgCl} + 0.059 \text{ pH} + E_{AgCl}^0$, $E_{AgCl}^0 (3.0 \text{ M KCl}) = 0.209 \text{ V}(25° \text{ C.})$.

CONCLUSIONS

In sum, highly selective $C_2$ products from $CO_2RR$ were obtained on B-doped Cu with stable electron localization. The electro-reduction of $CO_2$ to $C_2$ hydrocarbons, and its link with the oxidation state of Cu, were theoretically and experimentally confirmed. At the average Cu valence state of +0.35, a high Faradaic efficiency for $C_2$ hydrocarbons of about 80% was achieved. Under these conditions, $C_1$ products are completely suppressed both in gas and liquid products. B-doped Cu showed superior stability for $CO_2RR$ to $C_2$, achieving about 40 hours of initial sustained efficient operation.

The invention claimed is:

1. A catalyst system for catalyzing conversion of carbon dioxide ($CO_2$) into multi-carbon compounds, the catalyst system characterized in that the catalyst system comprises a boron-doped copper catalytic material, wherein the boron-doped copper catalytic material has a boron concentration that decreases with depth into the material, and further wherein the boron-doped copper catalytic material has a boron concentration of about 4-7 mol % proximate at the external surface of the catalyst and has a boron concentration below about 4 mol % beyond a depth of about 7 nm from the external surface; the boron concentration determined by Inductively coupled plasma optical emission spectrometry.

2. The catalyst system of claim 1, characterized in that the boron-doped copper catalytic material has a porous dendritic morphology.

3. The catalyst system of claim 1, characterized in that the boron-doped copper catalytic material has a particle size ranging from 30 to 40 nm as determined by scanning electron microscopy.

4. The catalyst system of claim 1, characterized in that the copper comprises Cu (111).

5. The catalyst system of claim 1, characterized in that the catalyst system further comprises:
   a gas-diffusion layer; and
   a catalyst layer comprising the boron-doped copper catalytic material applied to the gas-diffusion layer.

6. A method for electrochemical production of a multi-carbon hydrocarbon product, comprising:
   contacting $CO_2$ gas and an electrolyte with an electrode comprising the catalyst system as defined in claim 5, the catalyst system comprising a catalyst layer comprising the boron-doped copper catalytic material, and a gas-diffusion layer, wherein the gas-diffusion layer, when present, is arranged in such a way that the $CO_2$ gas diffuses through the gas-diffusion layer and contacts the catalyst layer, preferably, the gas-diffusion layer is hydrophobic;
   applying a voltage to provide a current density to cause the $CO_2$ gas contacting the catalyst layer to be electrochemically converted into the multi-carbon hydrocarbon product; and
   recovering the multi-carbon hydrocarbon product.

7. The method of claim 6, wherein the electrolyte comprises an alkaline potassium compound.

8. A method to produce the boron-doped copper catalytic material for a catalyst system according to claim 1, characterized in that the copper comprises Cu (111); and in that the boron-doped copper catalytic material is prepared via incipient wetness impregnation of a single crystal Cu (111) material with a boric acid aqueous solution.

9. The method of claim 8, characterized in that the impregnation step is followed by a calcination step.

10. The method of claim 8, characterized in that the doped metal catalytic material has a boron concentration ranging from 4 to 7 mol % at the external surface of the catalyst, and has a boron concentration below about 4 mol % beyond a depth of about 7 nm from the external surface, the boron concentration is determined by Inductively coupled plasma optical emission spectrometry.

11. A method of manufacturing a boron doped copper catalytic material for a catalyst system according to claim 1, in order to perform $CO_2$ reduction; the method being characterized in that the comprises a step of combining copper chloride ($CuCl_2$) with borohydride in solution to form catalyst precipitates in the solution and a step of recovering the catalyst precipitates from the solution; wherein the concentration in solution of the borohydride is ranging from 3 to 6 M, and wherein the concentration in solution of the $CuCl_2$ is ranging from 40 to 400 mg/m.

12. The method of claim 11, characterized in that the catalyst precipitates recovered from the solution are subjected to a drying step to form dried catalyst precipitates.

13. The method of claim 11, characterized in that the concentration in solution:
   of the borohydride is ranging from 4 to 5 M; or,
   of the $CuCl_2$ is ranging from 80 to 200 mg/mL.

14. The method of claim 11, characterized in that the solutions of $CuCl_2$ and a solution of the borohydride are provided in volume ratios ranging from 10:1 to 1:10.

* * * * *